United States Patent
Wu et al.

(10) Patent No.: US 10,043,573 B2
(45) Date of Patent: Aug. 7, 2018

(54) APPARATUS AND METHOD FOR ENDURANCE FRIENDLY PROGRAMMING USING LOWER VOLTAGE THRESHOLDS

(71) Applicant: INTEL CORPORATION, Santa Clara, CA (US)

(72) Inventors: Wei Wu, Portland, OR (US); Yi Zou, Portland, OR (US); Jawad B. Khan, Cornelius, OR (US); Xin Guo, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/228,699

(22) Filed: Aug. 4, 2016

(65) Prior Publication Data
US 2018/0040367 A1    Feb. 8, 2018

(51) Int. Cl.
*G11C 16/04* (2006.01)
*G11C 11/56* (2006.01)
(Continued)

(52) U.S. Cl.
CPC ........ *G11C 11/5628* (2013.01); *G06F 3/0608* (2013.01); *G06F 3/0661* (2013.01);
(Continued)

(58) Field of Classification Search
CPC . G11C 11/5628; G11C 16/10; G11C 11/5642; G06F 3/0679; G06F 3/0688; G06F 3/0608; G06F 3/0661
(Continued)

(56) References Cited

U.S. PATENT DOCUMENTS 5,754,469 A    5/1998  Hung et al.
8,248,124 B2   8/2012  Mosalikanti et al.
(Continued)

FOREIGN PATENT DOCUMENTS

KR    20110099563    9/2011

OTHER PUBLICATIONS

Li, J., et al., "How Much Can Data Compressibility Help to Improve NAND Flash Memory Lifetime?", Proceedings of the 13th USENIX Conference on File and Storage Technologies, Feb. 2015,15 pp.*
(Continued)

*Primary Examiner* — David Lam
(74) *Attorney, Agent, or Firm* — Konrad Raynes Davda & Victor LLP; David W. Victor

(57) ABSTRACT

Provided are a method and apparatus for endurance friendly programming using lower voltage thresholds. A non-volatile memory has storage cells organized as pages programmed using a first number of threshold voltage levels. The storage cells are organized into storage cell groups to which data is written. Each storage cell group is programmed to store a first number of bits of information. A memory controller selects a second number of bits of information from pages less than the first number of bits of information. The memory controller programs the storage cells of the storage cell group using threshold voltage levels from a second number of threshold voltage levels, wherein the second number of threshold voltage levels is less than the first number of threshold voltage levels and comprises a lowest of the first number of threshold voltage levels.

25 Claims, 17 Drawing Sheets

(51) Int. Cl.
*G06F 3/06* (2006.01)
*G11C 16/10* (2006.01)

(52) U.S. Cl.
CPC ........ *G06F 3/0688* (2013.01); *G11C 11/5642* (2013.01); *G11C 16/10* (2013.01)

(58) Field of Classification Search
USPC .......................... 365/185.03, 185.12, 185.24
See application file for complete search history.

(56) References Cited

U.S. PATENT DOCUMENTS

| | | | |
|---|---|---|---|
| 8,482,977 | B2 | 7/2013 | Kim et al. |
| 8,533,550 | B2 | 9/2013 | Khan |
| 8,751,904 | B2 * | 6/2014 | Wang .................. G06F 11/1048 714/764 |
| 9,251,060 | B2 | 2/2016 | Khan et al. |
| 2004/0037144 | A1 | 2/2004 | Pascucci et al. |
| 2007/0035994 | A1 | 2/2007 | Kong et al. |
| 2009/0073762 | A1 | 3/2009 | Lee et al. |
| 2009/0290414 | A1 | 11/2009 | Hosono |
| 2009/0327841 | A1 | 12/2009 | Litsyn et al. |
| 2011/0055461 | A1 | 3/2011 | Steiner et al. |
| 2011/0075478 | A1 | 3/2011 | Yoon et al. |
| 2013/0170296 | A1 | 7/2013 | Yun |
| 2013/0242653 | A1 | 9/2013 | Kim |
| 2013/0294157 | A1 | 11/2013 | Sharon et al. |
| 2013/0294159 | A1 | 11/2013 | Bauer |
| 2014/0056069 | A1 | 2/2014 | Park et al. |
| 2014/0071761 | A1 | 3/2014 | Sharon et al. |
| 2016/0371028 | A1 | 12/2016 | Berman et al. |

OTHER PUBLICATIONS

U.S. Appl. No. 15/276,588, entitled "Method and Appratus for Programming Non-Volatile Memory Using a Multi-Cell Storage Cell Group to Provide Error Location Information for Retention Errors", filed Sep. 26, 2016, invented by W. Wu et al., 56 pp.
Office Action 1 for U.S. Appl. No. 15/276,588, dated Jan. 26, 2017, 11 pp.
Response to Office Action 1 for U.S. Appl. No. 15/276,588, dated Apr. 26, 2017, 13 pp.
Cai, Y., et al., "Threshold Voltage Distribution in MLC NAND Flash Memory: Characterization, Analysis, and Modeling", Proceedings of the Conference on Design, Automation and Test in Europe 13, 2013, 6 pp.
Li, J., et al., "How Much Can Data Compressibility Help to Improve NAND Flash Memory Lifetime?", Proceedings of the 13th USENIX Conference on File and Storage Technologies, Feb. 2015, 15 pp.
Yaakobi, E., et al., "Error-Correcting Codes for TLC Flash", Flash Memory Summit, Aug. 2011, 24 pp.
U.S. Appl. No. 15/228,729, entitled "Apparatus and Method for Programming Non-Volatile Memory Using a Multi-Cell Storage Cell Group", Invented by W. Wu et al., filed Aug. 4, 2016, 51 pp.
Notice of Allowance 1 for U.S. Appl. No. 15/276,588, dated May 15, 2017, 9 pp.
Amendment 2 for U.S. Appl. No. 15/276,588, dated Aug. 4, 2017, 10 pp.
International Search Report and Written Opinion for International Application No. PCT/US2017/041603, dated Oct. 18, 2017, 12 pp.
Office Action 2 for U.S. Appl. No. 15/276,588, dated Sep. 26, 2017, 12 pp.
International Search Report and Written Opinion for International Application No. PCT/US2017/048514, dated Dec. 11, 2017, 12 pp.
International Search Report and Written Opinion for International Application No. PCT/US2017/041606, dated Oct. 19, 2017, 13 pp.
Office Action 1 for U.S. Appl. No. 15/228,729, dated Feb. 8, 2018, 31 pp.
Response to Office Action 2 for U.S. Appl. No. 15/276,588, dated Jan. 26, 2018, 13 pp.
U.S. Pat. No. 8,482,977, dated Jul. 9, 2013, is an English language equivalent of KR Publication No. 2011-0099563, dated Sep. 8, 2011.
Response to Office Action 1 for U.S. Appl. No. 15/228,729, dated May 8, 2018, 13 pp.

* cited by examiner

Compression Programming Mode

Page Metadata

Device Page Information

FIG. 7A

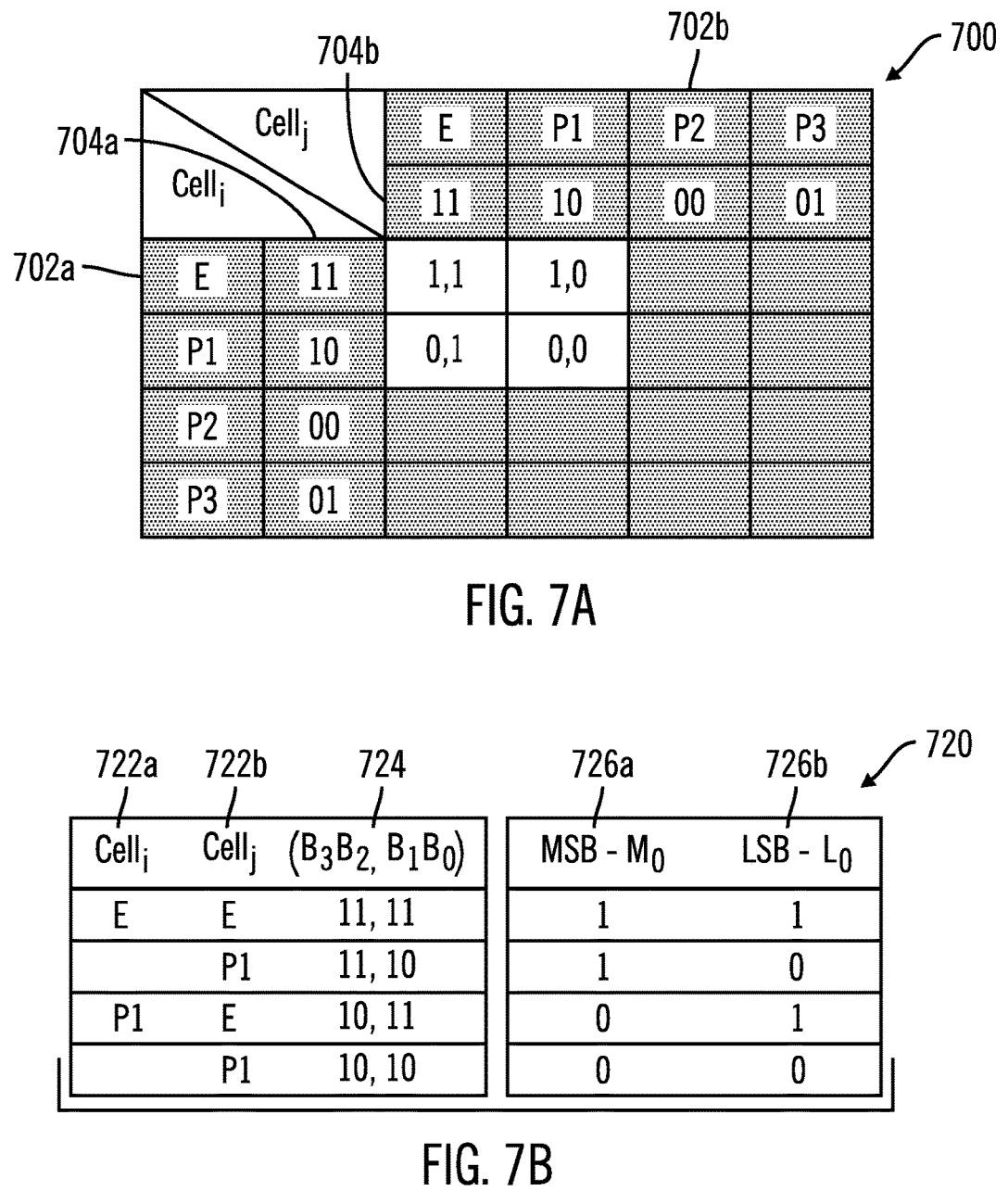

| | | Cell$_j$ | E | P1 | P2 | P3 |
|---|---|---|---|---|---|---|
| | Cell$_i$ | | 11 | 10 | 00 | 01 |
| E | 11 | | 1,1 | 1,0 | | |
| P1 | 10 | | 0,1 | 0,0 | | |
| P2 | 00 | | | | | |
| P3 | 01 | | | | | |

| Cell$_i$ | Cell$_j$ | ($B_3B_2, B_1B_0$) | MSB - $M_0$ | LSB - $L_0$ |
|---|---|---|---|---|
| E | E | 11, 11 | 1 | 1 |
| | P1 | 11, 10 | 1 | 0 |
| P1 | E | 10, 11 | 0 | 1 |
| | P1 | 10, 10 | 0 | 0 |

FIG. 7B

| Lower Page Compression Type | Upper Page Compression Type | Programming Mode |
| --- | --- | --- |
| Low | Low | Normal |
|  | Medium | Normal |
|  | High | Partial |
| Medium | Low | Normal |
|  | Medium | Partial |
|  | High | Partial |
| High | Low | Partial |
|  | Medium | Partial |
|  | High | Half |

FIG. 9A

LSB First:

FIG. 10A

| Cell$_i$ \ Cell$_j$ | E | P1 | P2 |
|---|---|---|---|
| E | _,11 | _,10 | _,00 |
| P1 | _,01 | | |
| P2 | | | |

(a) Programming LSB

FIG. 10B

| Cell$_i$ \ Cell$_j$ | E | P1 | P2 |
|---|---|---|---|
| E | 1,11 | 1,10 | 1,00 |
| P1 | 1,01 | | |
| P2 | | | |

(b) Programming MSB = '1'

FIG. 10C

| Cell$_i$ \ Cell$_j$ | E | P1 | P2 |
|---|---|---|---|
| E | _,11 | _,10 | _,00 |
| P1 | _,01 | 0,11 | 0,00 |
| P2 | 0,01 | 0,10 | |

(c) Programming MSB = '0'

LSB First Table

| 3 Input Bits | First Programming Cycle (Cell$_i$,Cell$_j$) | Second Programming Cycle (Cell$_i$,Cell$_j$) |
|---|---|---|
| 111 | No Programming, No Programming | No Programming, No Programming |
| 110 | No Programming, P1 | No Programming, No Programming |
| 100 | No Programming, P2 | No Programming, No Programming |
| 101 | P1, No Programming | No Programming, No Programming |
| 011 | No Programming, No Programming | P1, P1 |
| 000 | No Programming, P2 | P1, No Programming |
| 001 | P1, No Programming | P2, No Programming |
| 010 | No Programming, P1 | P2, No Programming |
|  |  |  |

| Cell_i \ Cell_j | E | P1 | P2 |
|---|---|---|---|
| E | 1,_ | | |
| P1 | | 0,_ | |
| P2 | | | |

(a) Programming MSB

FIG. 12B

| Cell_i \ Cell_j | E | P1 | P2 |
|---|---|---|---|
| E | 1,11 | 1,10 | 1,00 |
| P1 | 1,01 | | |
| P2 | | | |

(b) Programming LSB, w/ MSB = '1'

FIG. 12C

| Cell_i \ Cell_j | E | P1 | P2 |
|---|---|---|---|
| E | | | |
| P1 | | 0,11 | 0,00 |
| P2 | 0,01 | 0,10 | 0,01 |

(c) Programming LSB, w/ MSB = '0'

MSB First Table

| 3 Input Bits | First Programming Cycle (Cell$_i$,Cell$_j$) | Second Programming Cycle (Cell$_i$,Cell$_j$) |
|---|---|---|
| 111 | No Programming, No Programming | No Programming, No Programming |
| 110 | No Programming, No Programming | No Programming, P1 |
| 100 | No Programming, No Programming | No Programming, P2 |
| 101 | No Programming, No Programming | P1, No Programming |
| 011 | P1, P1 | No Programming, No Programming |
| 000 | P1, P1 | No Programming, P2 |
| 001 | P1, P1 | P2, P2 |
| 010 | P1, P1 | P2, No Programming |
| | | |

FIG. 13

APPARATUS AND METHOD FOR ENDURANCE FRIENDLY PROGRAMMING USING LOWER VOLTAGE THRESHOLDS

TECHNICAL FIELD

Embodiments described herein generally relate to a method and apparatus for endurance friendly programming using lower voltage thresholds.

BACKGROUND

Solid state storage devices (for example, solid state drives) may be comprised of one or more packages of non-volatile memory dies, where each die is comprised of storage cells, where storage cells are organized into pages and pages are organized into blocks. Each storage cell can store one or more bits of information. A multi-level cell (MLC) NAND representing two bits of information in two pages is programmed to represent two bits of information with four threshold voltage levels, E, P1, P2, and P3. The NAND flash memory is limited to a predetermined number of program/erase (P/E) cycles, and after that limit data retention becomes unreliable. A common metric to express lifetime is Total Bytes Written (TBW).

Data compression can extend the lifetime of NAND storage by improving storage efficiency. With compression, the total number of bytes (i.e. TBW) physically written into the storage is reduced, which reduces TBW and extends the NAND lifetime.

However, data compression techniques providing variations in the data compression ratio, use sophisticated FTL (Flash translation layer) and/or file system support to manage the smaller page and track the size of (or number of sectors of) compressed data.

There is a need in the art for improved techniques for storing compressed data in storage cells of a non-volatile memory storage device.

BRIEF DESCRIPTION OF THE DRAWINGS

Embodiments are described by way of example, with reference to the accompanying drawings, which are not drawn to scale, in which like reference numerals refer to similar elements.

FIG. 7A illustrates an embodiment of a cell-to-bit mapping of threshold voltage levels for a storage cell pair to two bits of information.

FIG. 7B illustrates a truth table to map storage cell threshold voltage levels to four bits read from the storage and to the two bits to return.

FIG. 9A illustrates an embodiment of a table providing programming modes based on the compression types for pages.

FIGS. 10A, 10B, and 10C illustrate a two-step programming of the least significant bits and then the most significant bit to a storage cell pair.

FIG. 11 illustrates a programming table of the programming steps to program a storage cell pair according to FIGS. 10a, 10b, and 10c.

FIGS. 12A, 12B, and 12C illustrate a two-step programming of the most significant bit and then the least significant bits to a storage cell pair.

FIG. 13 illustrates a programming table of the programming steps to program a storage cell pair according to FIGS. 12A, 12B, and 12C.

DESCRIPTION OF EMBODIMENTS

Prior art systems that compress data prior to storing in a NAND flash memory utilize sophisticated flash translation operations to manage the smaller page and track size or number of sectors or blocks of the compressed data. Other solutions may rotate where the compressed data is stored in the NAND flash memory, which requires complex data mapping operations.

Described embodiments provide techniques to store compressed data that do not change the page or block size or mapping of data to the storage cells, but instead utilizes lower threshold voltages to represent the states of the compressed data. Using the lower threshold voltages, such as using only the E, P1, and P2 threshold voltage levels of the available E, P1, P2, and P3 threshold voltage levels of a multi-level cell (MLC) NAND, provides less wear on the storage cells because the higher threshold voltages (P2, P3) provide greater wear of the storage cells, thus reducing their life at a greater rate than the lower threshold voltage levels. In this way, described embodiments modify the manner in which data is written using the lower threshold voltages available to provide an endurance friendly programming methodology.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

Figure 1:
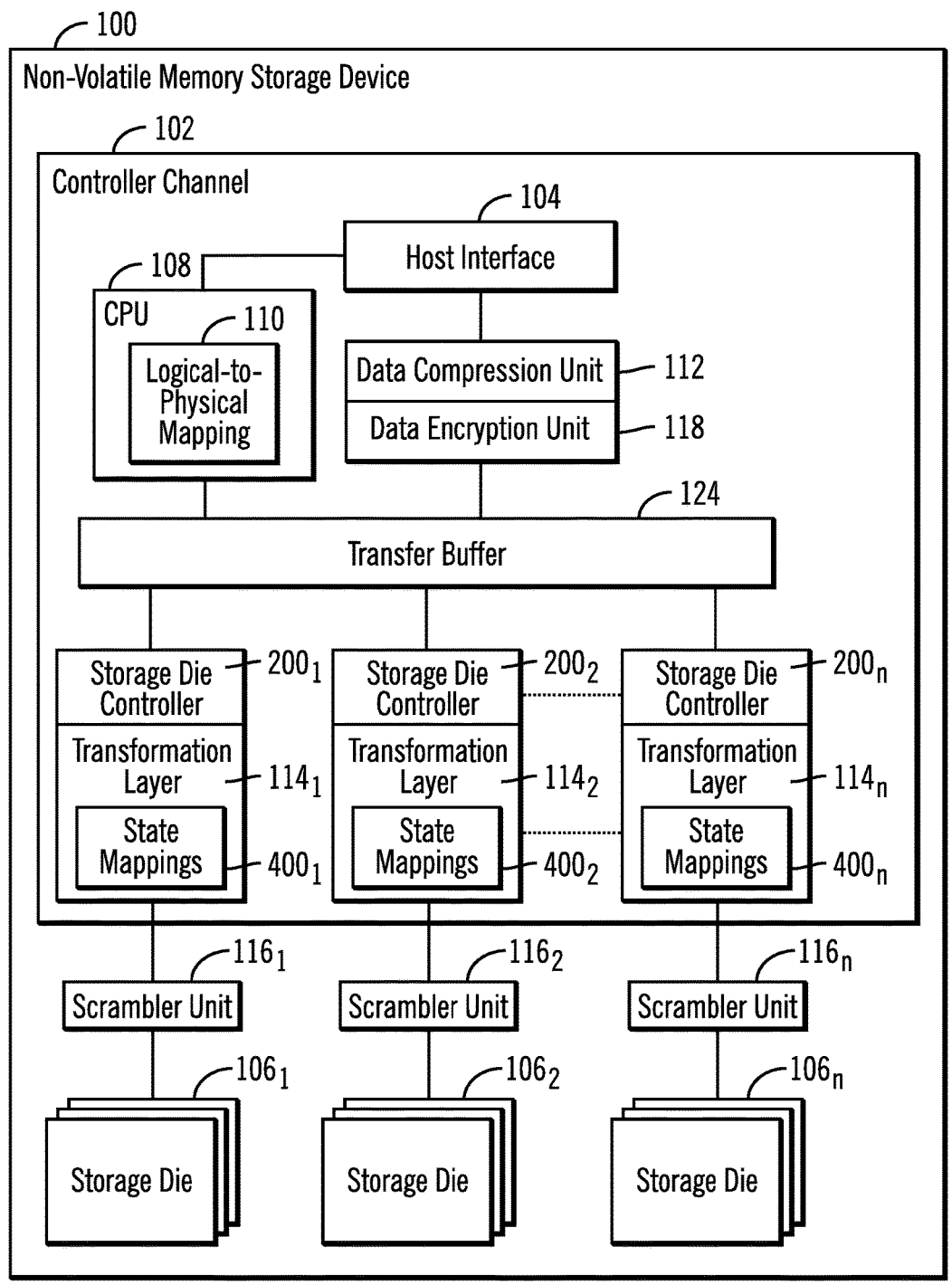
FIG. 1 illustrates an embodiment of a non-volatile memory storage device.

FIG. 1 illustrates an embodiment of a non-volatile memory storage device 100 having a controller channel 102, a host interface 104 to transfer blocks of data between a connected host system, and a plurality of groups of storage dies $106_1, 106_2 \ldots 106_n$ implementing storage cells that may be organized into pages of storage cells, where the pages are organized into blocks. The non-volatile memory storage device 100 may function as both a memory device and/or a storage device in a computing system, and may be used to perform the role of volatile memory devices and disk drives in a computing system. In an embodiment, the non-volatile memory storage device 100 may comprise a solid state drive (SSD) of NAND storage dies $106_1, 106_2 \ldots 106_n$. The controller channel 102 includes a central processing unit (CPU) 108 implementing certain control functions, such as a logical-to-physical mapping 110 provides a mapping of logical addresses to which I/O requests are directed and physical addresses in the storage dies $106_1, 106_2 \ldots 106n$.

The controller channel 102 includes a plurality of storage die controllers $200_1, 200_2 \ldots 200_n$ that manage read and write requests to blocks of data in pages of storage cells to groups of the storage dies $106_1, 106_2 \ldots 106_n$. A transformation layer $114_1, 114_2 \ldots 114_n$ for each of the storage die controllers $200_1, 200_2 \ldots 200_n$ transforms a received number of bits (e.g., k bits) in pages of data from the host to write to storage cell groups of multiple storage cells (each storing m bits, where m is >=k) in the storage dies $106_1, 106_2 \ldots 106_n$ and to transform a read m number of bits in a block to the fewer number of k bits of the block of data to return in pages to the host. A host operating system may code pages of data for the memory controller, where multiple of the pages provide the data for each of the multi-level storage cells, such as if each storage cell stores n bits, the host operating system would provide n pages to provide each of the n bits to code in a storage cell.

The transformation layer $114_1, 114_2 \ldots 114_n$ uses the state mappings $300_1, 300_2 \ldots 300_n$ to determine the translation functions to use to transform the fewer k bits to m bits and vice versa. In certain embodiments, the mapping operations for k bits in the received pages to the m bits stored in a storage cell group, and vice versa, are performed by the transformation layer $114_i$. In alternative embodiments, the mapping operations may be performed by the I/O logic 202, where the transformation layer $114_i$ is implemented in the I/O logic 202.

For instance, if each multi-level cell comprises n bits, then storage device 100 provides $2^n$ different threshold voltage levels to program the $2^n$ different states for a storage cell. If storage cells are grouped into groups of p storage cells each, then each storage cell group has $2^{np}$ states of information, and allow storage of m bits of information for a block of data, where $m=Log_2(2^{np})$ bits of information. The controller 102 and transformation layers $114_1, 114_2 \ldots 114_n$ may be programmed to only use j threshold voltage levels, less than the $2^n$ available threshold voltage levels. A storage cell group of p storage cells programmed to only use j threshold voltage levels would be capable of representing $j^p$ states with k bits of information, where k<m and k is a largest integer less than or equal to $Log_2(j^p)$.

The storage dies $106_1, 106_2 \ldots 106_n$ may comprise electrically erasable and non-volatile memory cells. For instance, the storage dies $106_1, 106_2 \ldots 106_n$ may comprise NAND dies of memory cells, also known as NAND chips or packages. In one embodiment, the NAND dies may comprise multilevel cell (MLC) NAND flash memories where each cell records two bit values, a lower bit value and an upper bit value. Alternatively, the NAND dies may comprise single level cell (SLC), multi-level cell (MLC), triple level cell (TLC) NAND memories, etc. The NAND dies, TLC, MLC, SLC, etc., may be organized in a three dimensional (3D) or two dimensional (2D) physical structure. The storage dies $106_1, 106_2 \ldots 106_n$ may further comprise ferroelectric random-access memory (FeTRAM), nanowire-based non-volatile memory, three-dimensional (3D) crosspoint memory such as phase change memory (PCM), memory that incorporates memristor technology, Magnetoresistive random-access memory (MRAM), Spin Transfer Torque (STT)-MRAM, a single level cell (SLC) Flash memory and other electrically erasable programmable read only memory (EEPROM) type devices.

The non-volatile memory storage device 100 may include a data compression unit 112 to compress received data from the host interface 104, a data encryption unit 118 to encrypt the compressed data and scrambler units $116_1, 116_2 \ldots 116_n$ to scramble the encrypted and compressed data before the controllers $200_1, 200_2 \ldots 200_n$ write the data to the storage dies $106_1, 106_2 \ldots 106_n$. The data provided to the controller $200_1, 200_2 \ldots 200_n$ may be compressed and include fewer bits of data than stored in the storage cells of the storage dies $106_1, 106_2 \ldots 106_n$. In alternative embodiments, there may be only the data compression unit 112, and not the encryption 114 and scrambler 116 units. In still further embodiments, the data compression unit 112, encryption unit 118, and/or scrambler units $116_1, 116_2 \ldots 116_n$ may be implemented in an external host system, such that fewer bits are provided to the host interface 104 to store than the number of bits stored in the storage cell.

The data from the host interface 104, that is subject to the compression 112 and encryption 114 is stored in a transfer buffer 124 from where it is transferred to the controllers $200_1, 200_2 \ldots 200_n$ and scrambled by the scrambler units $116_1, 116_2 \ldots 116_n$ to scramble before being written to the storage dies $106_1, 106_2 \ldots 106_n$.

The processing components in the non-volatile memory storage device 100, including the controllers $200_1, 200_2 \ldots 200_n$, compression unit 112, encryption unit 118, and scrambler units $116_1, 116_2 \ldots 116_n$ may be implemented as firmware or in one or more application specific integrated circuits (ASIC) within the non-volatile memory storage device 10. Alternatively, these components may be implemented in a software program executed by a processor of the non-volatile memory storage device 100.

The host interface 104 connects the memory device 100 to a host system (not shown). The memory device 100 may be installed or embedded within a host system, such as shown and described with respect to FIG. 18, or the memory device 100 may be external to the host system. The host interface 104 may comprise a bus interface, such as a Peripheral Component Interconnect Express (PCIe) interface, Serial AT Attachment (SATA), Non-Volatile Memory Express (NVMe), etc.

In certain embodiments, the storage dies $106_1$, $106_2$ ... $106_n$ may comprise n-bit multi-level cells, where each cell can be programmed into $2^n$ states represented by $2^n$ different threshold voltage levels. For a multi-level cell (MLC) NAND flash memory storing 2 bits per cell, there may be four voltage thresholds, E, P1, P2, and P3 to represent the four states that may be programmed into cells. A tri-level cell (TLC) flash memory cell may be programmed with eight threshold voltage levels. In certain embodiments, the storage die controller $200_i$ may organize storage cells for writing into storage cell groups comprising p storage cells. For example, for an n-bit cell organized into a cell group of p, each cell group can store m bits of information, where m=log $2(2^{np})$, and each storage cell group may represent $2^{np}$ different states, which can be programmed with $2^{np}$ different voltage level combinations. The pages of cells may be organized into a block of pages, where an erase operation to restore the state of the cells to the E or erase state is performed on a block basis.

The transformation layers $114_1$, $114_2$ ... $114_n$ may receive a block of k bits of information to write, which is less than the m bits of information for a block in a storage cell group. The fewer k bits may result from compression or the host operating system being programmed to provide a block of data comprising k bits. To reduce the wear on the storage cells, described embodiments use a set of the lowest threshold voltage levels that is less than all the available threshold voltage levels, to represent all possible states of the received k bits. Because fewer bits are being written, the states may be expressed with a smaller number of threshold voltage levels. Further, because programming the cells with the higher voltage levels results in greater wear on the cells, programming the fewer k bits with the lower threshold voltage levels of all available threshold voltage levels reduces the wear on the storage cells. For instance, the transformation layer $114_1$, $114_2$ ... $114_n$ may only need to use the lowest j threshold voltages of the available $2^n$ threshold voltages to represent the states of the k bits, where j is the smallest integer $>=2^{k/p}$, where k is the received bit size and p is the number of cells in a storage cell group.

Figure 2:
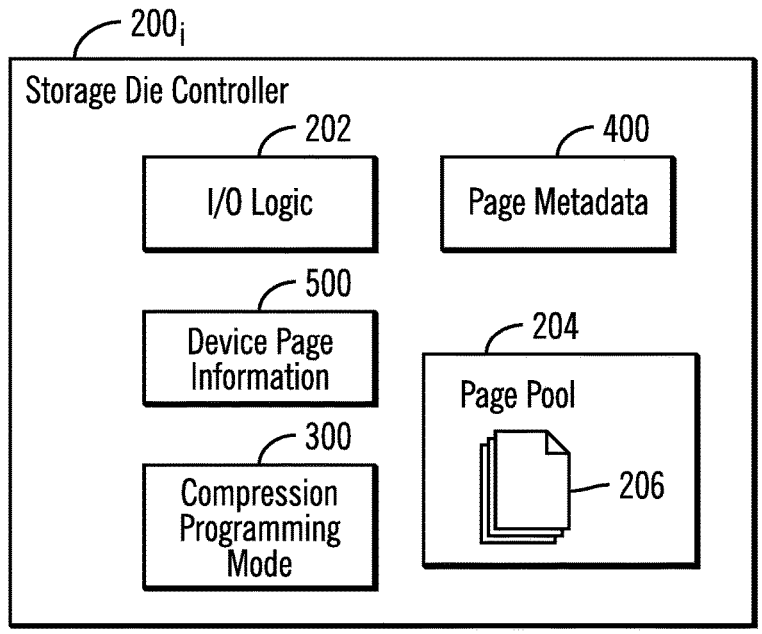
FIG. 2 illustrates an embodiment of a storage die controller.

FIG. 2 shows additional components that may be included in each storage die controller $200_i$ managing writes to a group of storage dies $106_i$, including Input/Output (I/O) logic 202 processes read/write commands from an attached host (not shown) in a command queue (not shown), from which the commands are accessed and executed. The I/O logic 202 maintains a page pool 204 of a plurality of available pages 206 for the storage dies $106_i$ and device page information 500 having information on device pages configured to use pages 206 from the page pool 204. Each device page having n bits per storage cell may be assigned n pages 206 from the page pool 204 to store the blocks of data. An MLC NAND having two bits per storage cell, would have an upper and lower pages, a triple level cell (TLC), would have three bits per storage cell and three pages for the three bits.

Each storage die controller $200_i$ may further maintain compression information 300 having information on translation functions needed to translate a read m bits of information from the storage cell group to the k bits of data that were written using less than all available threshold voltage levels. The compression information 300 may provide different translation functions for different received numbers of k bits depending on realized compression ratios. For instance, if the compression unit 112 provides a variable number of compressed bits k, the different compression information instances $300_i$ provide the different translation functions needed to translate a read m bits of data from a storage cell group to different numbers of k bits for the compression unit 112.

In alternative embodiments, the controller 102 may receive different number of bits, less than the m number of bits stored in the storage cell group, not due to compression, but from application operations and the number of bits applications are providing or from other elements in the device 100.

In certain embodiments, the storage cells are grouped into pages and the pages are grouped into blocks, where different bits in a cell are written to different pages. In an MLC flash, the first most significant bits (MSB) are written to one page and the least significant bits to another page, referred to as upper and lower pages. For a TLC memory, the three bits for each storage cell are written to three different pages. In MLC flash, data can be erased at a block at a time to set the storage cells to the E threshold voltage level. The storage cells can be programmed a byte or word at a time.

For instance for a storage cell group comprising a storage cell pair, i.e., p=2, the number of possible states or bits of information that may be stored in a storage cell pair group is sixteen states or four bits of information that can be programmed with 16 threshold voltage level combinations. However, if the non-volatile memory storage device 100 is programmed to use a fewer number of threshold voltages, such as use three of the four available threshold voltages for an MLC NAND memory, then the highest P3 voltage is not needed and the possible states of the received three bits can be represented with the three lowest threshold voltage levels, such as E, P1, and P2.

Figure 3:
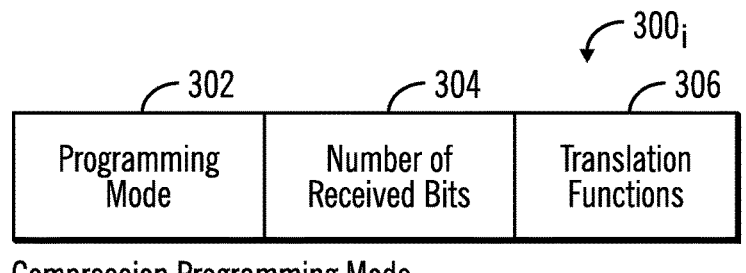
FIG. 3 illustrates an embodiment of compression information.

FIG. 3 illustrates an embodiment of an instance $300_i$ of the compression programming mode used to program the storage dies as including a programming mode 302 identifying how the data is programmed in a storage cell group based on a compression type of the data in the pages from which the bits are selected. Compression types may comprise three categories: low (e.g., a compression ratio >=1 and <1.33), medium compression (e.g., a compression ratio >=1.33 and <2), and high compression (e.g., a compression ratio >2); a number of received bits 304, such as k, to which the ratio applies, where the number of received bits 304 is less than the total number m bits that may be stored in a storage cell group of m bits; and translation functions 306 that implement the programming mode 302, and may include cell mappings to map the k received bits 304, or k, to states coded using number of threshold voltages per storage cell. If the data is not to be mapped, such as if the read block of data (m bits) is the same as the received block (k bits) write data, then the translation functions 306 may indicate no translation is needed. If j threshold voltages are used of the $2^n$ available threshold voltages, where there are $2^n$ states per storage cell, the number of bits being mapped k comprises a largest integer less than or equal to $\log_2(j^p)$. Thus, there is a translation function for each of the k bits that need to be returned using values from one or more of them read bits, where m>k. Thus, the translation functions 306 of a programming mode 302 are used to map received k bits to threshold voltages to program m bits of information in a storage cell group and map a read m bits of information in a storage cell group to the received k bits to implement the programming mode 302.

Figure 4:
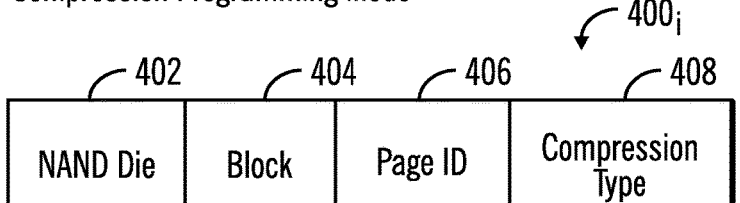
FIG. 4 illustrates an embodiment of page metadata.

FIG. 4 illustrates an instance $400_i$ of the page metadata 400 maintained for each of the pages 122 available in the page pool 120, including a NAND die 402, block 404, page identifier 406 to locate one of the pages in the storage dies $106_1, 106_2 \ldots 106_n$ and the compression type 408, such as associated with a range of compression ratios with which the page $400_i$ can be used.

Figure 5:
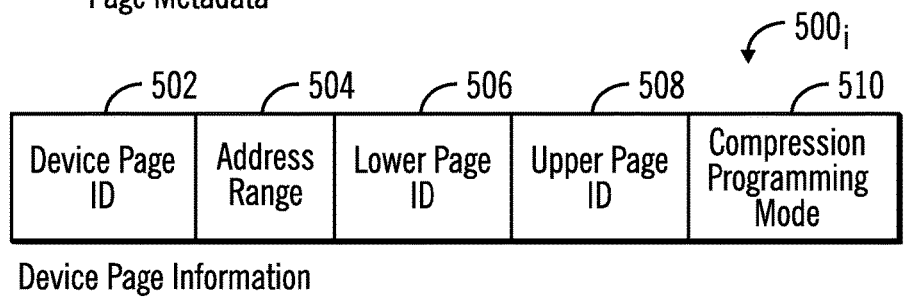
FIG. 5 illustrates an embodiment of device page information for a device page.

FIG. 5 illustrates an instance of device page information $500_i$ for a page of data storing the data for the n-bit storage cells, including a device page identifier 502, an address range 504 of addresses stored in the page $500_i$, a lower page ID 506 identifying one of the pages $400_i$ allocated as a lower page to store one bit of the storage cell; an upper page ID 508 to store one bit of the storage cell, where there may be n pages allocated to a device page for an n-bit storage cell; and a programming mode 510 indicating the programming mode $300i$ having the translation functions 302 used to translate for a compression type (low, medium, high) for the data stored in the device page 402.

In certain embodiments, the multiple pages provide the bits to code in a storage cell group. In an MLC flash, two pages provide the bits for each storage cell, where one page has the first most significant bits (MSB) and the other page has the least significant bits to another page, referred to as upper and lower pages. For a TLC memory, the three bits for each storage cell are written to three different pages. In MLC flash, data can be erased at a block at a time to set the storage cells to the E threshold voltage level. An entire page (usually 1 kB, 2 KB or 4 kB) is written together.

Figures 6A, 6B:
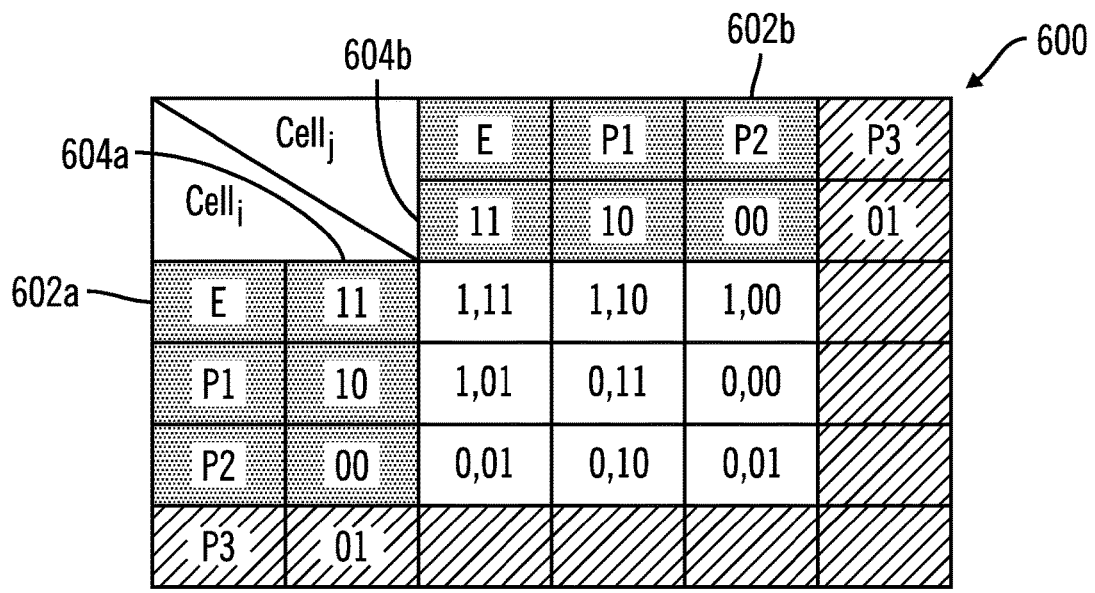
FIG. 6A illustrates an embodiment of a cell-to-bit mapping of threshold voltage levels for a storage cell pair to three bits of information.
FIG. 6B illustrates a truth table to map storage cell threshold voltage levels to four bits read from the storage and to the three bits to return.

FIG. 6A illustrates an embodiment of a cell-to-bit mapping 600 to map k=3 bits of information supplied by multiple of the pages (upper and lower or first and second pages to a storage cell pair, where there are two storage cells in a storage cell group (p=2), and there are two bits stored in a cell, i.e., a MLC storage cell. The mapping 600 may be implemented in the bit translation functions 412 that would determine from the mapping 600 the threshold voltages to use to program the received k bits. The mapping 600 shows that the highest P3 threshold voltages are not used to program the received three bits, and shows that all nine possible states of the three bits may be represented by the three lowest threshold voltages E, P1, and P2 in the storage cells$_{i,j}$, where i and j may be consecutive numbers representing consecutive storage cells. The first column 602a shows the different programming states E, P1, and P2 for cell$_i$ and the first row 602b shows the different programming states E, P1, and P2 for cell$_j$ of the storage cell pair. The second column 604a and second row 604b show the normal 2 bit coding for each storage cell, wherein the first bit is for a lower page and a second bit is for the upper page. The cells of the table show the nine possible states of the received three bits to store, and columns 602a and rows 602b show the threshold voltages to use for the first (cell$_i$) and second (cell$_j$) cells of the pair, respectively.

FIG. 6B shows a truth table 620 based on the mapping 600 that shows the different threshold voltage levels for the first cell in the voltage column 622a and for the second cell in the voltage column 622b, the full four bits in the bit column 624 coded by the threshold voltages 622a, 622b and the MSB and LSBs for the three bit values represented by the threshold voltages in the voltage columns 622a, 622b in the bit columns 626a, 626b, respectively. The truth table 620 only uses the three lowest voltage thresholds E, P1, and P2 of the available threshold voltage levels E, P1, P2, and P3 used when expressing all possible 16 states of the 4 bits that can be stored in the storage cell pair.

From the truth table 620, upon selecting three bits to write from pages in the transfer buffer 124, the MSB and LSBs of the received three bits are coded using the three lowest threshold voltages as shown in the columns 622a, 622b for the received three bits in the columns 626a, 626b. The truth table 620 is used to determine how the read and decoded four bit state from a storage cell pair, represented in the bits in column 624 maps to the received three bits 626a, 626b that were written to the storage cell pair.

The four bits read from the pair of storage cells may be translated to the received three bits based on the truth table 620 as follows, where $M_0$ is the MSB bit, $B_0$, $B_1$, $B_2$, $B_3$ correspond to the four bits read from a storage cell pair, $L_0$ is a first least significant bit of the three bits, $L_1$ is a second least significant bit of the three bits, $B_0'$, $B_3'$, and $B_1'$ represent inverses of the value, "+" is an OR function, and "*" is an AND function:

$$M_0 = B_2 + B_3 * B_0 \tag{1}$$

$$L_0 = B_0 + B_3'*B_1' + B_3*B_2'*B_1 \tag{2}$$

$$L_1 = B_2*B_1 + B_1*B_0' \tag{3}$$

Thus, the translation function 306 is provided for a programming mode 302 where the number of bits in a storage cell group is three, the number of storage cells in a storage cell group is two, the number of threshold voltages is three (E, P1, P2), and the number of states is nine, implement the mappings 600 and truth table 620 of FIGS. 6a and 6b to map the received k bits to the number of m bits stored in the storage cell group and then map the read m bits from a storage cell group to the received k bits to return to a host. For instance, to map the read block of four bits from a storage cell pair of MLC NAND cells (n=2) to the initially received 3 bits, the above three translation functions (1), (2), and (3) can be used to translate the read four bits from the storage cell pair to the received three bits to return to the requesting host.

FIG. 7A illustrates an embodiment of a cell-to-bit mapping 700 to map k=2 bits of information selected from two pages to a storage cell pair, where there are two storage cells in a storage cell group, and there are two bits stored in a cell (n=2_, i.e., a MLC storage cell. The mapping 700 shows that the highest P3 and P2 threshold voltages are not needed to program the received two bits, and shows all four possible states of the two bits represented by the two lowest threshold voltages E and P1 in the storage cell$_{i,j}$. The first column 702a shows the different programming states E and P1 for cell$_i$ and the first row 702b shows the different programming states E and P1 for cell$_j$ of the storage cell pair. The second column 704a and second row 704b show the normal 2 bit coding for each storage cell, wherein the first bit is for a lower page and a second bit is for the upper page. The cells of the table show the four possible states of the received two bits to store, and rows and columns show the threshold voltages to use for the first (cell$_0$) and second (cell$_1$) cells of the pair.

FIG. 7B shows a truth table 720 based on the mapping 700 that shows the different threshold voltages for the first cell in the voltage column 722a and for the second cell in the voltage column 722b, the full four bits in the bit column 624 coded by the threshold voltages 722a, 722b and the MSB and LSB for the two bit values represented by the threshold voltages in the voltage columns 722a, 722b in the bit columns 726a, 726b, respectively. The truth table 720 only uses the two lowest voltage thresholds E and P1 of the available threshold voltage levels E, P1, P2, and P3 used when expressing all possible 16 states of the 4 bits that can be stored in the storage cell pair.

From the truth table 720, upon receiving the two bits to store, the MSB and LSB of the received two bits are coded using the two lowest threshold voltages as shown in the columns 722a, 722b for the received two bits in the columns 726a, 726b. The truth table 720 is used to determine how the read and decoded four bit state from a storage cell pair, represented in the four bits in column 724 maps to the received two bits 726a, 726b that were written to the storage cell pair.

The four bits read for a block from the pair of storage cells may be translated to the received block of two bits based on the truth table 720 as follows, where $M_0$ is the MSB bit, $B_0$, $B_1$, $B_2$, $B_3$ correspond to the four bits read from a storage cell pair, $L_0$ is the least significant bit of the two bits:

$$M_0 = B_2 \qquad (4)$$

$$L_0 = B_0 \qquad (5)$$

Thus, the translation function 306 where the number of bits of information (k) is two, the number of storage cells in a storage cell group is two, the number of threshold voltages is two (E, P1), and the number of states is four, implement the mappings 700 and truth table 720 of FIGS. 7a and 7b to map the received k bits to the number of m bits stored in the storage cell group and then map the read m bits from a storage cell group to the received k bits to return to a host. For instance, to map the read four bits from a storage cell pair of MLC NAND cells (n=2) to the initially received two bits, the above translation functions (4) and (5) can be used to translate the read four bits from the storage cell pair to the received two bits to return to the requesting host.

Figure 8:
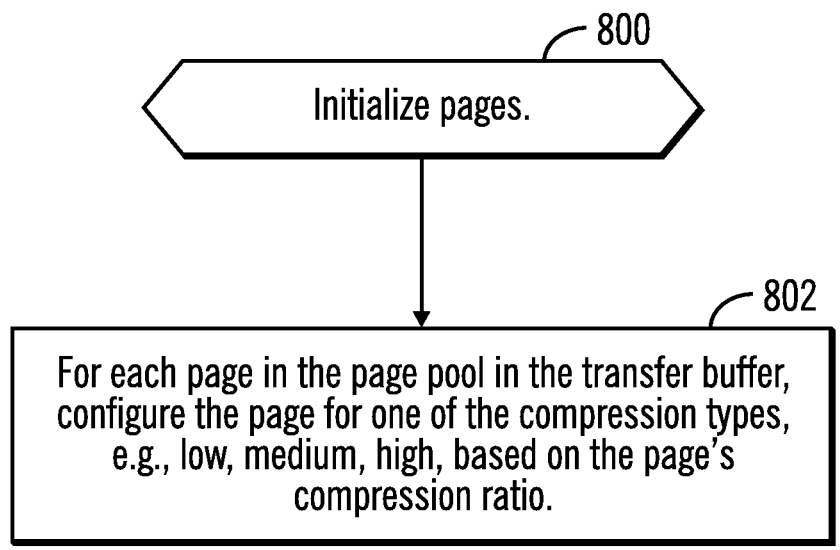
FIG. 8 illustrates an embodiment of operations to initialize pages in a page pool.

FIG. 8 illustrates an embodiment of operations performed by the I/O logic 108 to configure the pages 122 in the page pool 120 into different compression types. The compression type of the data is determined by the data compression unit 118 and can be any compression ratio value between 1 (no compression) to 8192 (1 KB becomes 1 bit after compression). Upon initiating page configuration (at block 800), the I/O logic 202, or other component, for each page 206 in the page pool 204 in the transfer buffer 124, configure (at block 802) configure the page for one of compression types, such as low compression type (e.g., a compression ratio between 1 and 1.33), medium compression type (e.g., a compression ratio between 1.33 and 2) and a high compression type (e.g., a compression ratio greater than 2), based on the page compression ratio. The configuration may be performed when pages are included in the transfer buffer 124. The pages for each of the compression ratios are configured (at block 804) and the page compression 308 is indicated in the page metadata $400_i$ for each of the configured pages 122. In this way, the pages 122 in the page pool 120 are fixed to have a size commensurate with a compression type, such that pages associated with a higher compression type have fewer bits than pages associated with a lower compression type.

Figure 9:
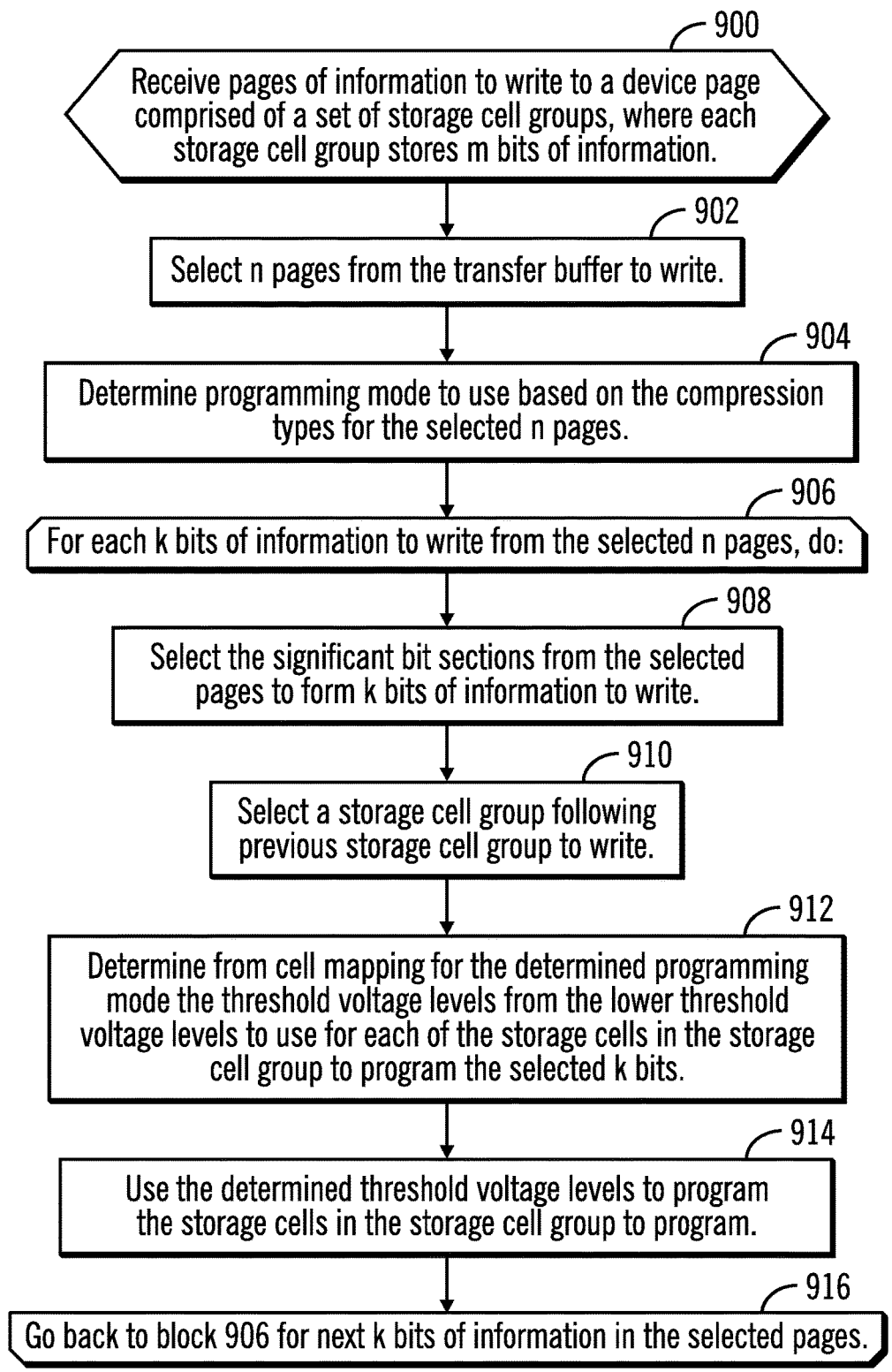
FIG. 9 illustrates an embodiment of operations to write multiple pages of data to device pages organized as a storage cell group(s).

FIG. 9 illustrates an embodiment of operations performed by the I/O logic 202 and transformation layer $114_i$ to process pages in the transfer buffer 124 providing blocks of k bits of information to write to storage cell groups, where each storage cell group stores m bits of information, where m>k. Upon processing (at block 900) multiple pages in a device page $500_i$ providing instances of the k bits to write to storage cell groups, the I/O logic 202 selects (at block 902) n pages in the transfer buffer 124 to write. The I/O logic 202 or transformation layer $114_i$ determines (at block 904) from the compression types for the selected n pages the programming mode $300_i$ to use to determine the threshold voltages to use to program the bits selected from each of the pages for a storage cell group.

FIG. 9a provides an embodiment of a table 900 that may be used to select a programming mode 952 providing translation functions 306 to program bits selected from two pages for a storage cell group comprising two bits based on the compression types 408 indicated in the columns 954 and 956 of the table for the two pages. For instance, one MLC NAND device page $500_i$ requires two data pages 506, 508. If both pages are medium compression type, then the device page is configured with a "Partial MLC Mode" for a case where 3 bits (k=3) are provided to store in the storage cell pair capable of storing 4 bits of information, as shown in FIGS. 6A and 6B. If both pages are "High Compression", the device page can be configured as "Half MLC Mode" where 2 bits (k=2) are provided to store, such as shown in FIGS. 7A and 7B. The table 950 in FIG. 9a further indicates the programming mode 952 if the compression type is unknown for one page, and assume the worst case compression type, e.g., low compression. For instance, in some scenarios, there may be only one page available in the transfer buffer 124, and the I/O logic 202 has to decide what type of programming mode should be used. An aggressive decision will limit the opportunity. In one embodiment, a conservative strategy is used that the future second page is not compressed (low), which has the largest size of data bits. In alternative embodiments, other strategies may be used to predict the compression type for the future second page.

For each instance of k bits of information in the selected n pages a loop of operations is performed at blocks 906 through 916. At block 908, the transformation layer 114 selects (at block 908) the significant bit sections, e.g., most significant bits (MSB), least significant bits (LSBs), etc., from the selected pages to form k bits of information to write. A storage cell group is selected (at block 910) comprising a first selected storage cell group or following the previous storage cell group written. The transformation layer $114_i$ determines (at block 912) from the cell mapping, e.g., FIG. 6a, 6b, 7a, 7b, for the determined programming mode $300_i$ of the threshold voltage levels from the lower threshold voltage levels to use for each of the storage cells in the storage cell group to program the selected k bits. The selected threshold voltages may be from a subset of the lowest threshold voltage levels available for the storage cells. The transformation layer $114_i$ uses (at block 914) the determined threshold voltage levels to program the storage cells in the storage cell group to program.

FIGS. 10A, 10B, and 10C provide an embodiment for programming three bits read from two pages to each storage cell group of two storage cells in two programming cycles. The storage cells each store two bits (n=2) and each storage cell group comprises a storage cell pair (p=2). The mappings show how to map the received three bits to the storage cells storing four bits, using the three lowest voltage levels. The arrows in FIG. 10C show the permissible voltage level changes to the state by programming one or both cells to one of the voltages P1, P2 of the available three threshold voltage levels P1, and P2. Avoiding programming the cells to the highest possible voltage level P3 reduces the wear of the storage cells and extends their life.

FIG. 10A shows that no voltage needs to be applied to program the LSBs to the E threshold voltage or "11", during the first programming cycle, which would have been programmed during a block erase. During a first programming cycle, programming the second storage cell$_j$ of the pair to the P1 threshold voltage programs the LSBs to 10, programming the second storage cell$_j$ of the pair to the P2 threshold voltage programs the LSBs to 10, and programming the first storage cell$_i$ of the pair to the P1 threshold voltage programs the LSBs to 01.

FIG. 10B shows a second programming step to program the MSB bit to a 1 by not performing any programming of either of the cells$_{i,j}$.

FIG. 10C shows the second programming step to program the MSB bit to a "0" by setting one or both of the cells$_{i,j}$ to one of the threshold voltages P1, P2 from the previous programmed state for the LSBs. FIG. 9C shows that the MSB is programmed to "0" by: (1) programming the first cell$_i$ and the second cell$_j$ of the pair to the P1 threshold voltages when the LSBs equal "11", or cells were not programmed in the first step; (2) programming the first storage cell$_i$ of the pair to the P2 threshold voltage when the LSBs were previously programmed to "10", "01"; (3) programming the first storage cell$_i$ of the pair to the P1 threshold voltage when the LSBs were previously programmed to "01".

FIG. 11 provides a table showing how the pair of storage cells$_{i,j}$ are programmed during the first and second programming cycles for the different possible three bits when the LSBs are programmed first, based on the table mappings shown in FIGS. 10A, 10B, and 10C. The programming of FIG. 11 would be used when writing the LSBs first to one of the storage cell pairs. Different programming steps may be provided than those shown in FIG. 11 to program the LSB first.

FIGS. 12A, 12B, and 12C provide an embodiment for programming the received block (e.g., read and write unit) of three bits in the storage cell group when the MSB bit is programmed first to the storage cell pair, where the storage cells each store two bits (n=2) and each storage cell group comprises a storage cell pair (p=2). The arrows in FIGS. 12B and 12C show the permissible voltage level changes to the states in FIG. 12A by programming one or both cells to one of the voltages P1, P2 of the available four threshold voltage levels P1, P2, and P3. Avoiding programming the cells to the highest possible voltage level P3 reduces the wear of the storage cells and extends their life.

FIG. 12A shows that no voltage needs to be applied to program the MSB to the E threshold voltage or "1", which would have been programmed before during a block erase. During a first programming step, programming the first storage cell$_i$ and the second storage cell$_j$ of the pair to the P1 threshold voltage programs the MSB to "0".

FIG. 12B shows a second programming step to program the LSB bits with an MSB bit of 1 by setting the cells$_{i,j}$ to one of the three lowest threshold voltages E, P1, P2 of the available four threshold voltage levels E, P1, P2, and P3. No voltage needs to be applied to program the LSBs to the E threshold voltage to program a "11" when the MSBs is "1". FIG. 12B shows that the LSBs are programmed when the MSB is first programmed to "1" by: (1) programming the first cell$_0$ of the pair to the P1 threshold voltages to program the LSBs to "01"; (2) programming the second storage cell$_j$ of the pair to the P1 threshold voltage to program the LSBs to "10"; and (3) programming the second cell$_j$ to the P2 threshold voltage to program the LSBs to "00".

FIG. 12C shows the second programming step to program the LSBs when the MSB was set to a "0" by setting the cells$_{i,j}$ to one of the threshold voltages P1, P2 from the previous programmed state for the LSBs. FIG. 12B shows that the LSBs are programmed when the MSB is first programmed to "0" by: (1) programming the first cell$_i$ and the second cell$_j$ of the pair to the P2 threshold voltages to program the LSBs to "01"; (2) programming the second storage cell$_1$ of the pair to the P2 threshold voltage to program the LSBs to "00"; (3) programming the first storage cell$_i$ of the pair to the P2 threshold voltage to program the LSBs to "10"; (4) programming both the first storage cell$_i$ and second storage cell$_j$ to the P2 threshold voltage to program the LSBs to "01".

FIG. 13 provides a table showing how the pair of storage cells$_{i,j}$ are programmed during the first and second programming cycles for the different possible three input bits when the MSB is programmed first, based on the table mappings shown in FIGS. 12a, 12b, and 12c. The programming of FIG. 13 would be used when performing the writing of the MSBs and LSBs in FIGS. 12A and 12B, where the MSB is programmed first.

Figure 14A:
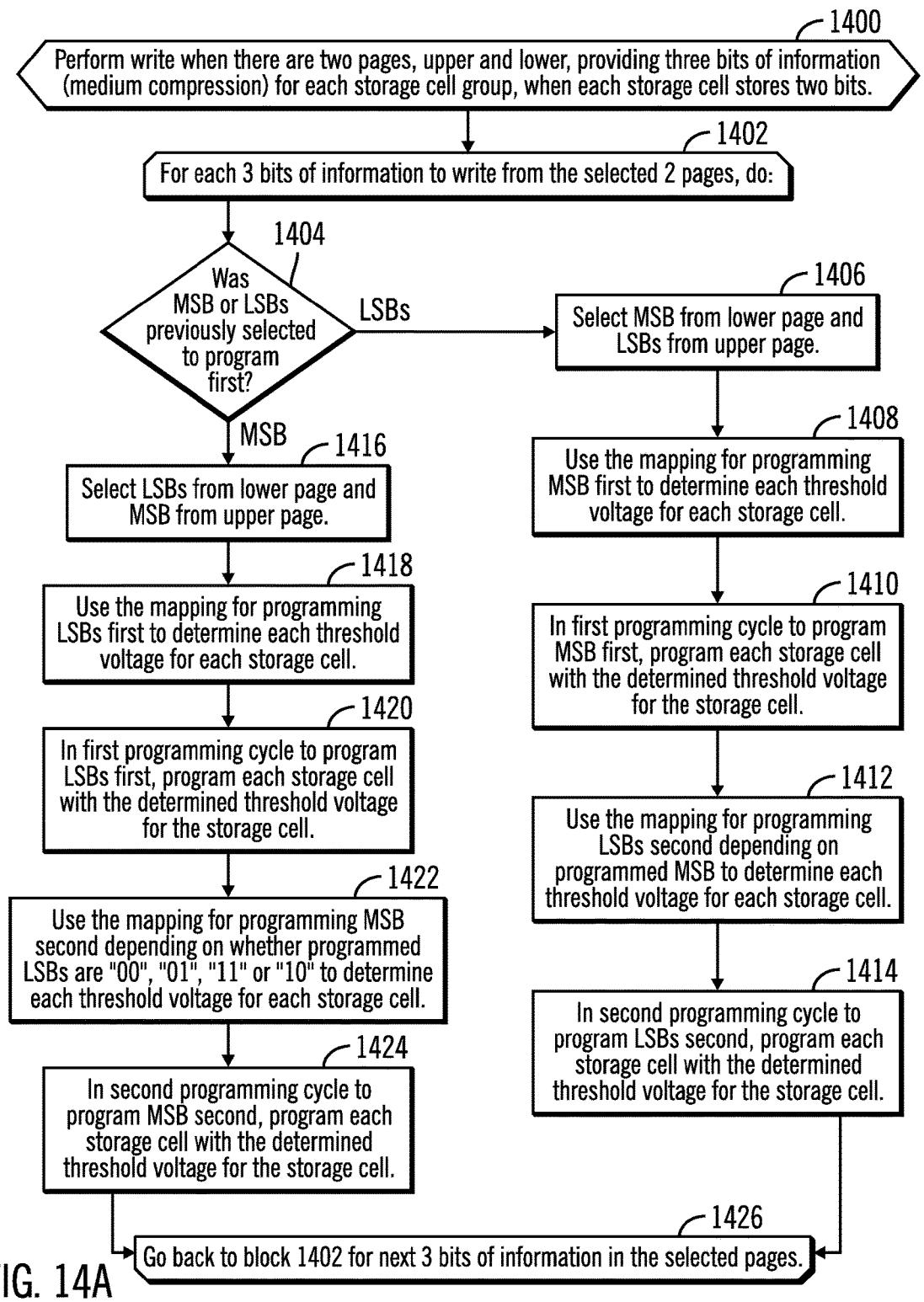
FIGS. 14A, 14B, and 14C provide operations for translating between the bits to write and the information on the bits stored.
Figure 14B:
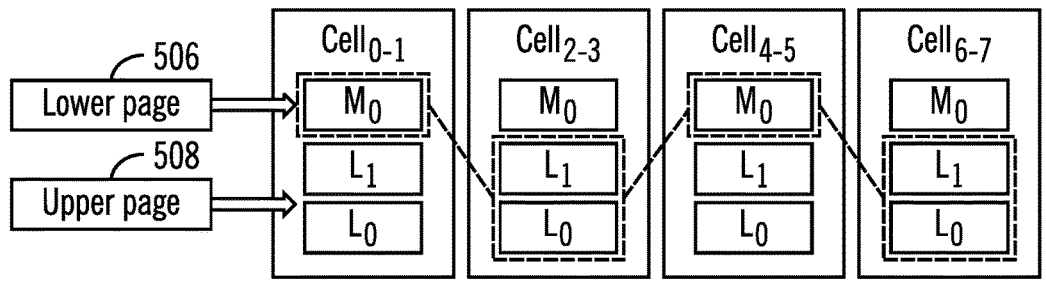
Figure 14C:
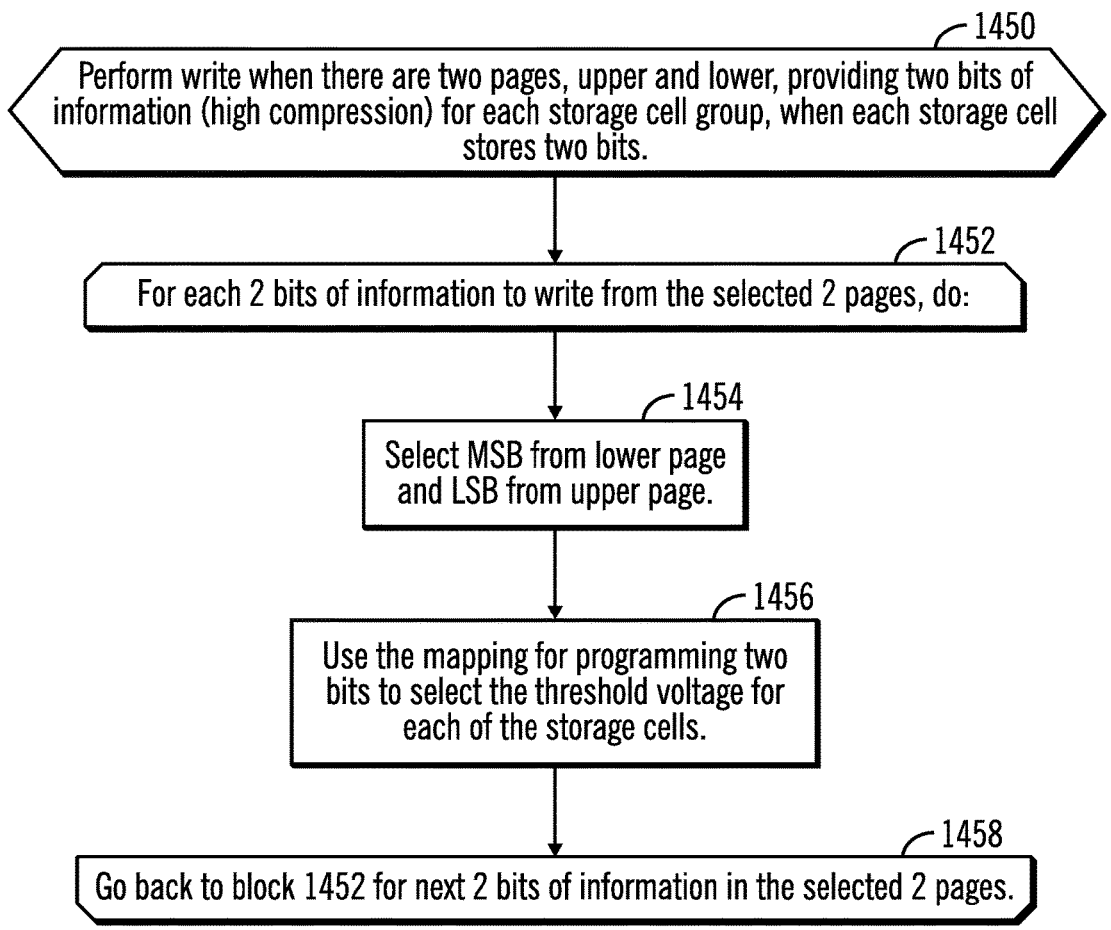

FIGS. 14A, 14B, and 14C illustrate different embodiments for performing the operations at blocks 806 and 808 using the mappings shown in FIGS. 10A, 10B, 10C, 11, 12A, 12B, 12C, 13 in embodiments where each storage cell comprises a storage cell pair of two storage cells (p=2) and each storage cell has 2 bits (n=2), and each device page 500$_i$ is allocated two pages, a lower 506 and upper 508, such as the case for an MLC NAND.

FIG. 14A illustrates an embodiment of operations to program the storage cell pairs when the number of received bits for each block to write from the selected two pages, upper and lower, is three (for a medium compression ratio) and each storage cell group is a pair of two storage cells (n=2). Upon initiating the write (at block 1400) for selected upper and lower pages, the transformation layer 114$_i$ performs a loop of operations at blocks 1402 through 1426 for each 3 bits of information to write from the two pages. At block 1404, a determination is made as to whether the one MSB or the LSBs were selected to program first for the last storage cell pair written. If (at block 1404) the LSBs were programmed first for a previous storage cell pair or if the current storage cell to program is the first to program, the transformation layer 114$_i$ selects (at block 1406) the MSB from the selected lower page and the two LSBs from the upper page. The mapping for the programming the MSB first (FIG. 12A, 13) is used (at block 1408) to determine each threshold voltage for each storage cell of the storage cell pair being programming. In a first programming cycle to program the MSB first, each storage cell of the pair is programmed (at block 1410) with the determined threshold voltage for the storage cell. The transformation layer 114$_i$ uses (at block 1412) the mapping for programming LSBs second (as in FIGS. 12B, 12C, 13) depending on whether the MSB was programmed to a 1 (FIG. 12B) or 0 (FIG. 12C) to determine each threshold voltage for each storage cell. In a second programming cycle to program the two LSBs second, the transformation layer 114$_i$ programs (at block 1414) each storage cell with the determined threshold voltage for the storage cell.

If (at block 1404) the one MSB was programmed first for a previous storage cell pair or if the current storage cell to program is the first to program, the transformation layer 114$_i$ selects (at block 1416) the MSB from the selected upper page and the two LSBs from the lower page. The mapping for the programming the LSBs first (FIG. 10A) is used (at block 1418) to determine each threshold voltage for each storage cell of the storage cell pair being programming. In a first programming cycle to program the LSBs first, each storage cell of the pair is programmed (at block 1420) with the determined threshold voltage for the storage cell. The transformation layer 114$_i$ uses (at block 1422) the mapping for programming MSB second (as in FIGS. 10A, 10B, 10C, 11) depending on whether programmed LSB s are "00", "01", "11", or "10" to determine each threshold voltage for each storage cell. In a second programming cycle to program the one MSB second, the transformation layer 114$_i$ programs (at block 1424) each storage cell with the determined threshold voltage for the storage cell.

FIG. 14B illustrates the operations of FIG. 14A in that the MSB and LSBs are alternately selected from the lower and upper pages between storage cell groups to alternate selecting the first MSB bit and two LSB bits between the lower 506 and upper 508 page. For instance as shown in FIG. 13B, for the first pair storage cells$_{0,1}$, the MSB ($M_0$) is selected from the lower page 506 and LSBs upper page 508 and then in cells$_{2,3}$ the MSB is alternately selected from the upper page 508 and the LSBs from the lower page 506.

FIG. 14C illustrates an embodiment of operations to perform the programming cycles when the two pages provide blocks of two bits (high compression ratio) to write and each storage cell group is a pair of two storage cells and where each of the selected pages 506 or 508 provides one bit for every other storage cell. Upon initiating (at block 1450) the writing, the transformation layer 114$_i$ performs a loop of operations at blocks 1452 through 1458 to transform the received 2 bits per storage cell pair. The MSB and LSBs are selected (at block 1454) from the lower and upper pages, respectively. The mapping (FIGS. 7A, 7B) for programming two bits, one from each of the pages, is used (at block 1456) to select the threshold voltage levels from each of the storage cells, where only the two lowest threshold voltage levels need to be used to program all possible states of the storage cell pair having just two bits.

Although FIGS. 14A, 14B, 14C are described with respect to an embodiment of storage cells storing two bits (n=2) and each storage cell group comprising a storage cell pair (p=2), the writing of the fewer number of received k bits to a group of storage cell storing m bits can be extended to other size storage cell groups and storage cells storing more than two bits by alternating the pages to which the fewer number of the MSB bits are written. Alternating the pages to which the smaller number of the MSB bits of the k bits are written distributes the smaller number of MSB bits and larger number of LSBs among the pages to provide wear leveling of the writing to the pages.

Figure 15:
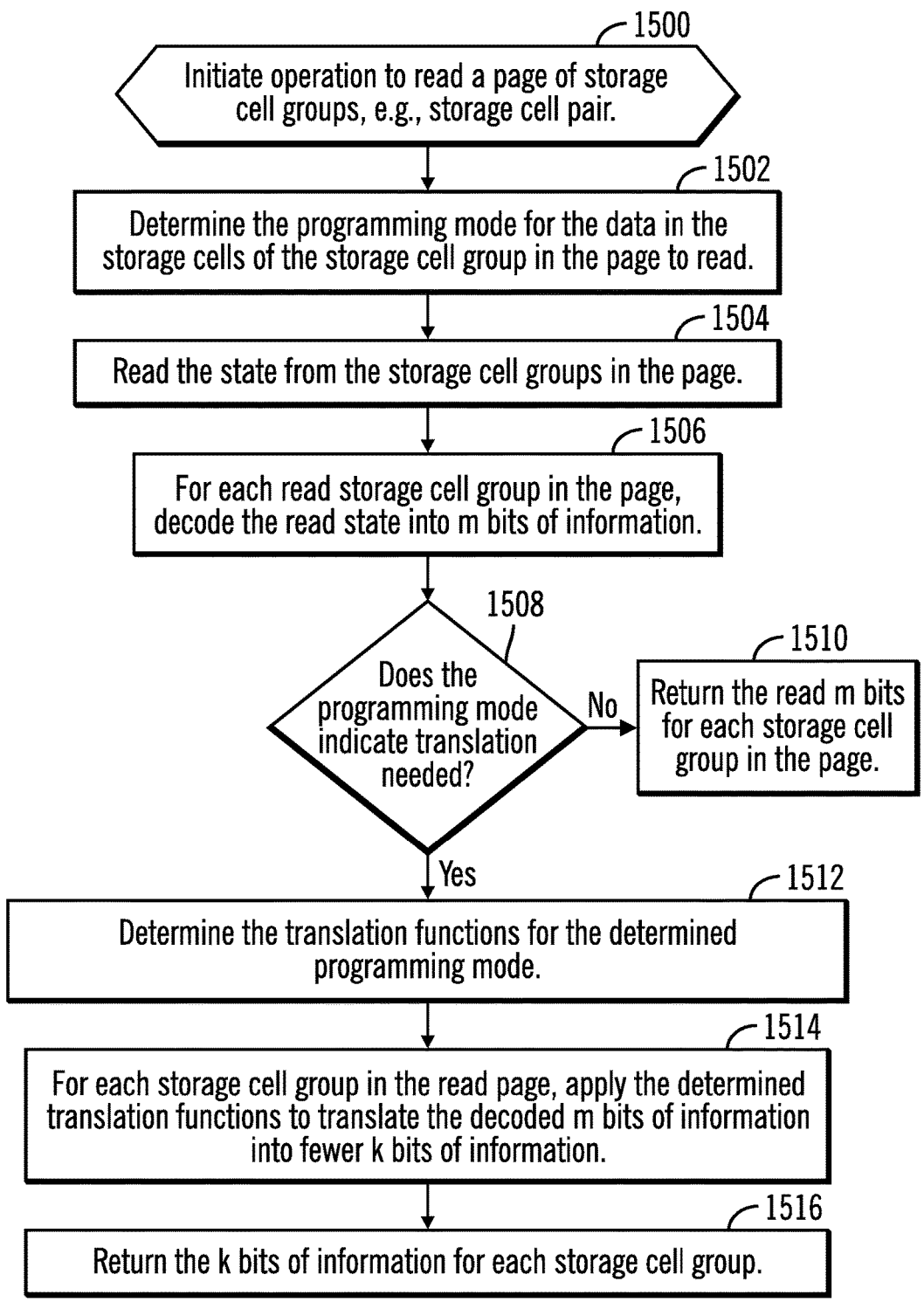
FIG. 15 illustrates an embodiment of operations to read a storage cell pair.

FIG. 15 illustrates an embodiment of operations performed by the I/O logic 202 and/or the transformation layer 114$_i$ to read a page of storage cell groups, such as storage cell pairs. Upon initiating (at block 1500) the read operation for a device page 500$_i$ of storage cell groups, the I/O logic 202 determines (at block 1302) the programming mode 300$_i$ for the bit information read from the storage cell groups. The programming mode 300$_i$ may be determined from programming mode 510 indicated in the device page information 500$_i$ for the device page being read from the storage cell groups. The state from the storage cell group is read (at block 1504), such as a threshold voltage level for each of the p storage cells in the storage cell group. The I/O logic 202 decodes (at block 1506) the read state represented by read threshold voltage levels from the p cells in the storage cell group. If (at block 1508) the programming mode 300$_i$ indicates that there is no translation, or no translation functions 306, then the transformation layer 114$_i$ returns (at block 1510) the read m bits of information. If (at block 1508) the determined compression programming mode 300$_i$ indicates translation is needed, then the I/O logic 202 determines (at block 1512) the translation functions 306 for the determined programming mode 300$_i$, such as the translation functions (1), (2), (3), (4), and (5) described above with respect to a storage cell pair and a compression ratio where k=3 bits and where k=2 bits. The transformation layer 114$_i$ applies (at block 1514), for each storage cell group in the read page, the determined translation functions to translate the decoded m bits of information to a fewer k bits of information and returns (at block 1516) the read k bits. When entire page of bits is returned, the compression unit 112 decompresses when an entire device page is returned.

With the described operations of FIG. 15, the transformation layer 114$_i$ uses the normal page mapping by writing to the same storage cells without requiring special translation to manage the page and track size, because the described embodiments read the data for all the storage cells on the page boundaries, but translates the read m bits of information into a fewer k bits provided by the compression unit 112. Further, the described embodiments take advantage of compression to improve storage cell endurance by avoiding use the highest threshold voltage levels to write the compressed data using the lower threshold voltage levels.

Figure 16:
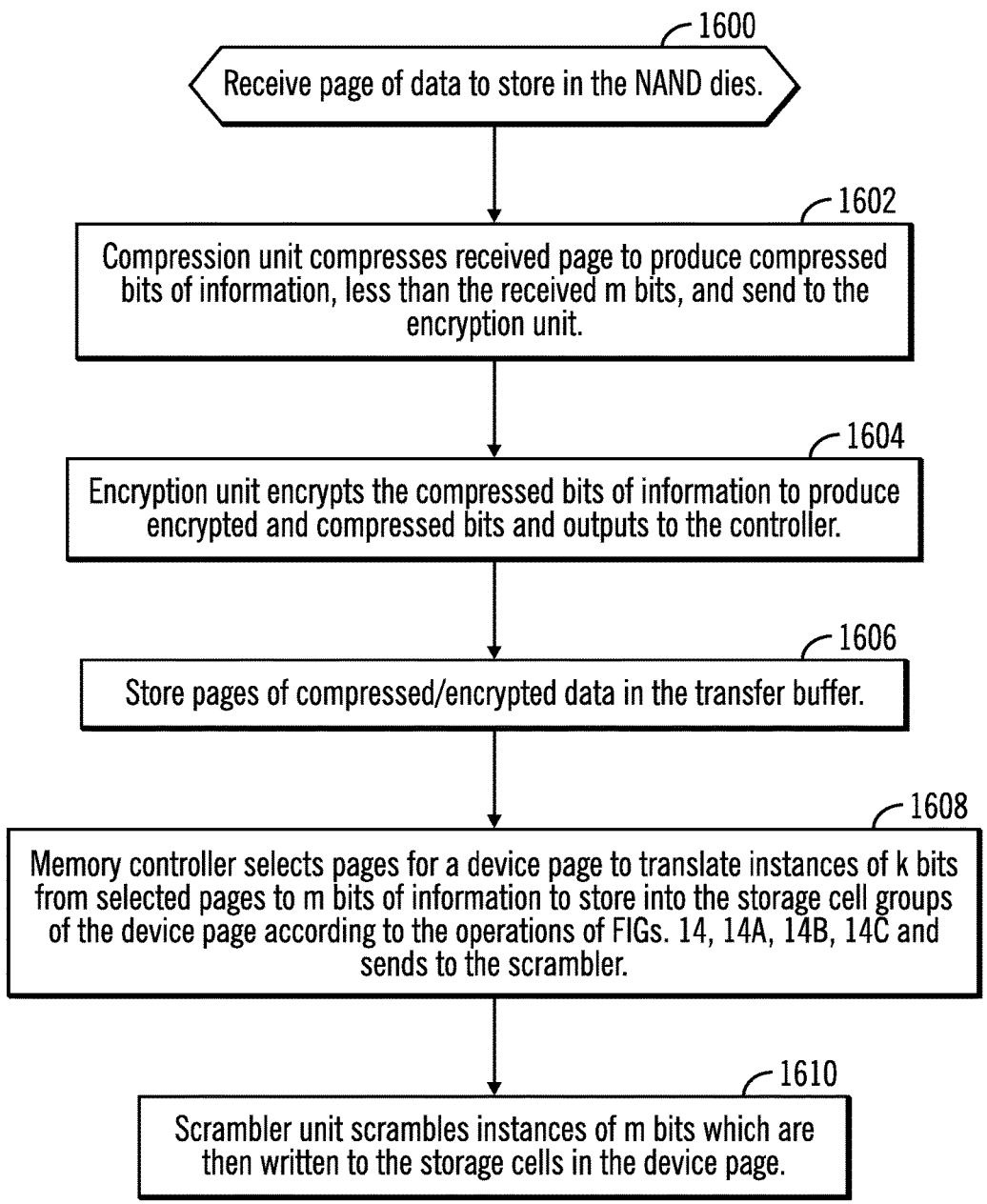
FIG. 16 illustrates an embodiment of operations to compress, encrypt, and scramble a page of data.

FIG. 16 illustrates an embodiment of operations performed by the components of the non-volatile memory storage device 100 to process a page of bits of information to store in the storage dies 106$_1$, 106$_2$ ... 106$_n$, including the data compression unit 112, data encryption unit 118, scrambler unit 116$_i$, and controller 200$_i$. Upon receiving (at block 1600) a page of data to store in the NAND storage dies 106$_1$, 106$_2$ ... 106$_n$, the compression unit 112 compresses (at block 1602) the received page to produce instances of compressed bits of information and sends to the encryption unit 118. The encryption unit 118 encrypts (at block 1604) the compressed bits of information in the page to produce encrypted and compressed bits of information and outputs the page to the controller 102. The pages of the compressed/encrypted data are stored (at block 1606) in the transfer buffer 124. The storage die controller 200$_i$ and transformation layer 114$_i$ selects (at block 1608) the pages for a device page to translate instances of k bits from the selected pages to m bits of information to store in the storage cell groups of the device page according to operations of FIGS. 14, 14A, 14B, and 14C and sends to the scrambler unit 116$_i$. The scrambler unit 116$_i$ scrambles (at block 1610) instances of the translated m bits in a device page which are then written to the storage cells in the storage die 106$_i$.

Figure 17:
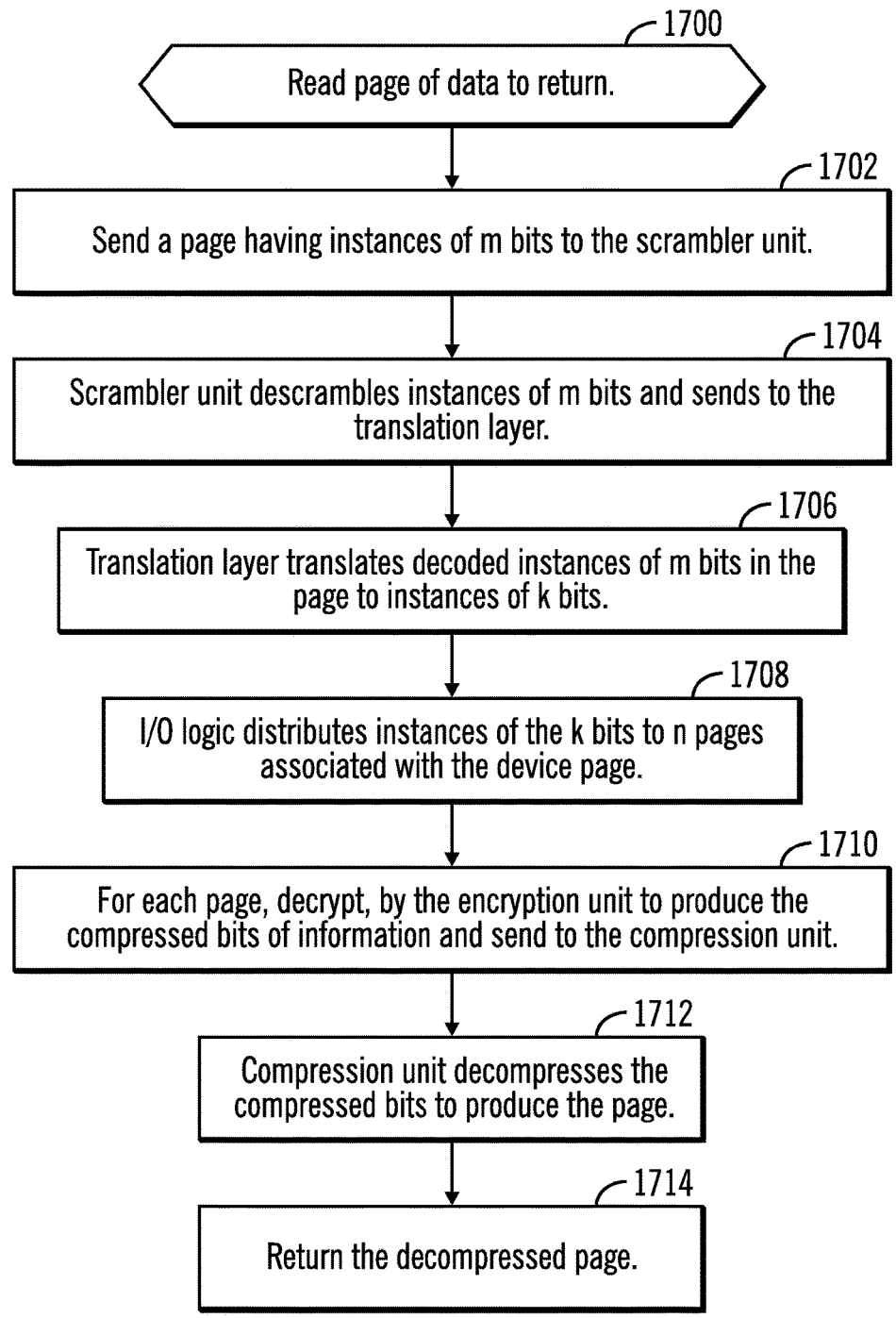
FIG. 17 illustrates an embodiment of operations to descramble, decrypt, and decompress data in a storage device.

FIG. 17 illustrates an embodiment of operations performed by the components of the non-volatile memory storage device 100 to process data read from the storage dies 106$_1$, 106$_2$ ... 106$_n$, including the data compression unit 112, data encryption unit 118, scrambler unit 116$_i$, and controller 200$_i$. Upon reading (at block 1700) a page of data to return from storage cell pairs in a storage die 106$_i$, the page having instances of m bits is sent (at block 1702) to the corresponding scrambler unit 116$_i$ for the storage die 106$_i$. The scrambler unit 116$_i$ descrambles (at block 1704) the instances of m bits in the page and sends to the translation layer 114$_i$ The translation layer 114$_i$ translates (at block 1706) the instances of read m bits from the page into the instances of k bits according to the operations of FIG. 15. The I/O logic 202 distributes (at block 1708) instances of the k bits to n pages associated with the device page 500$_i$. The encryption unit 118 decrypts (at block 1710) for each page to produce the page having compressed bits of information and sends to the compression unit 112. The compression unit 112 decompresses (at block 1712) the page to produce the decompressed pages to return (at block 1714).

Figure 18:
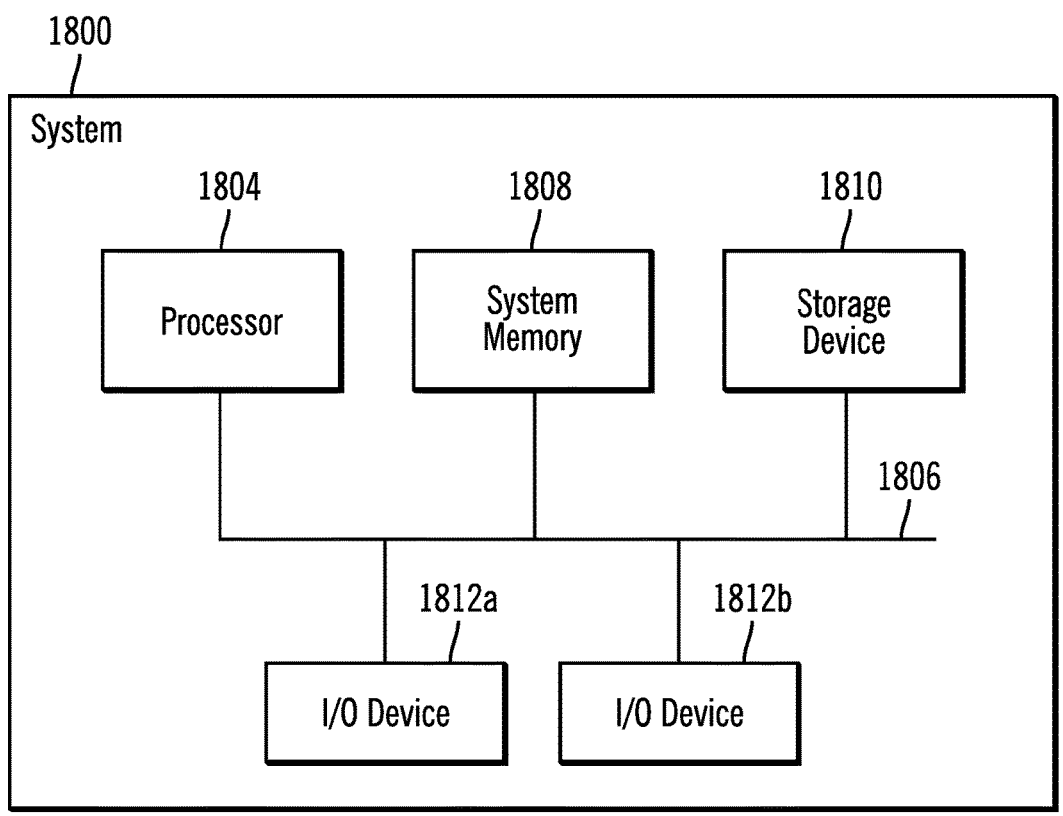
FIG. 18 illustrates a system in which the memory device of FIG. 1 may be deployed.

FIG. 18 illustrates an embodiment of a system 1800 in which the memory device 100 may be deployed as the system memory device 1808 and/or a storage device 1810. The system includes a processor 1804 that communicates over a bus 1806 with a system memory device 1808 in which programs, operands and parameters being executed are cached, and a storage device 1810, which may comprise a solid state drive (SSD) that stores programs and user data that may be loaded into the system memory 1808 for execution. The processor 1804 may also communicate with Input/Output (I/O) devices 1812*a*, 1812*b*, which may comprise input devices (e.g., keyboard, touchscreen, mouse, etc.), display devices, graphics cards, ports, network interfaces, etc. The memory 1808 and storage device 1810 may be coupled to an interface on the system 1800 motherboard, mounted on the system 1800 mother board, or deployed in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

The reference characters used herein, such as i, j, m, n, and p are used to denote a variable number of instances of an element, which may represent the same or different values, and may represent the same or different value when used with different or the same elements in different described instances.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

EXAMPLES

The following examples pertain to further embodiments.

Example 1 is an apparatus to program information in storage cells of a memory device, comprising: a non-volatile memory having storage cells organized as pages, wherein each multi-level cell comprises a number of bits and can be programmed with information using a first number of threshold voltage levels, wherein the storage cells are organized into storage cell groups to which data is written, wherein each storage cell group is programmed to store a first number of bits of information; and a memory controller configured to program the storage cells and to: select a second number of bits of information from pages to write to one of the storage cell groups, wherein the second number of bits of information is less than the first number of bits of information; and program the storage cells of the storage cell group using threshold voltage levels from a second number of threshold voltage levels, wherein the second number of threshold voltage levels is less than the first number of threshold voltage levels and comprises a lowest of the first number of threshold voltage levels.

In Example 2, the subject matter of examples 1 and 3-12 can optionally include that the program the storage cells translates the second number of bits of information into the first number of bits of information to program using the threshold voltage levels from the second number of threshold voltage levels.

In Example 3, the subject matter of examples 1, 2 and 4-12 can optionally include that each multi-level cell comprises n bits and can be programmed into $2^n$ separate states with $2^n$ different threshold voltage levels, wherein the first number of threshold voltage levels comprises $2^n$, wherein each of the storage cell groups has p storage cells, wherein each storage cell group represents $2^{np}$ states of information, wherein the first number of bits of information comprises m bits of information, where $m=\text{Log}_2(2^{np})$ bits of information, and wherein the selected second number of bits comprises k bits, where k<m, and wherein the second number of threshold voltage levels comprises j threshold voltage levels comprising only a j lowest of the $2^n$ different threshold voltage levels, wherein $j<2^n$ and j is a smallest integer greater than or equal to $2^{k/p}$.

In Example 4, the subject matter of examples 1-3 and 5-12 can optionally include that the memory controller is further to: read a state of the storage cells in the storage cell group; decode the read state into decoded bits having the first number of bits of information; translate the decoded bits into translated bits having the second number of bits of information; and return the translated decoded bits to pages.

In Example 5, the subject matter of examples 1-4 and 6-12 can optionally include that the memory controller is further to: indicate one of a plurality of programming modes used for compression types of the pages from which bits are selected to store, wherein at least one of the programming modes is associated with translation functions based on a truth table associating states of the second number of bits of information with a subset of states of the first number of bits of information that are programmed using the second number of threshold voltage levels; read the first number of bits of information from one of the storage cell groups; and use the translation functions associated with the programming mode for the data in the storage cell group to translate the read first number of bits of information in one of the storage cell groups into a translated second number of bits of information.

In Example 6, the subject matter of examples 1-5 and 7-12 can optionally include that the memory controller is further to: configure pages used to store bits of information, wherein each of the configured pages is indicated as having one of the compression types, wherein the compression types include a low compression type, medium compression type, and high compression type, wherein the pages indicated as having the high compression type have fewer bits than pages having the low compression type and the medium compression type; determine a programming mode for the selected second number of bits of information from the pages, wherein the programming mode is based on the compression types of the pages from which the second number of bits of information are selected; and use the translation functions associated with the determined programming mode to determine the threshold voltage levels from the second number of threshold voltages to use to program the first number of bits of information in the storage cell group for the selected second number of bits of information.

In Example 7, the subject matter of examples 1-6 and 8-12 can optionally include that each of the storage cell groups comprises a storage cell pair of two storage cells, wherein the each of the storage cells stores two bits of information, wherein the first number of bits of information comprises four bits, wherein the second number of bits of information are selected from two pages, wherein in a first programming mode, the second number of bits of information comprises three bits, and wherein the translation functions for the first programming mode translates the read four bits from the storage cells into three bits, and wherein in a second programming mode, the second number of bits of information comprises two bits, and wherein the translation functions for the second programming mode translates the read four bits into two bits.

In Example 8, the subject matter of examples 1-7 and 9-12 can optionally include that the memory controller is further to: determine a programming mode of data to read from the storage cell groups; read instances of the first number of bits of information from the storage cell groups to read; and translate the read instances of the first number of bits of information to translated instances of second number of bits of information using translation functions associated with the determined programming mode.

In Example 9, the subject matter of examples 1-8 and 10-12 can optionally include that each of the storage cell groups comprises a storage cell pair of two storage cells wherein each of the storage cells store two bits, wherein the select the second number of bits of information comprises two bits, select a first bit from a lower page and a second bit from an upper page, wherein the second number of bits of information comprises three bits including one most significant bit (MSB) and two least significant bits (LSBs) programmed into the two storage cells in the storage cell group using threshold voltages from the second number of threshold voltages to program each of the two storage cells.

In Example 10, the subject matter of examples 1-9 and 11-12 can optionally include that the memory controller is further to select the two bits by selecting the bits from a first page and a second page for a current storage cell group comprises selecting one most significant bit and two least significant bits from different of the first and second pages from which the most significant bit and the two least significant bits were selected for a previous storage cell group programmed before the current storage cell group is programmed.

In Example 11, the subject matter of examples 1-10 and 12 can optionally include a compression unit to receive as input pages and outputs instances of the pages with compressed data to the memory controller and to receive as input pages of compressed data to decompress to decompressed data.

In Example 12, the subject matter of examples 1-11 can optionally include a compression unit; an encryption unit; and a scramble unit; wherein the compression unit receives as input pages to compress to produce the pages compressed to send to the encryption unit and to decompress the pages received from the encryption unit to produce the data in the pages decompressed, wherein the encryption unit encrypts the compressed pages from the compression unit to produce an encrypted and compressed pages of bits of information and receives encrypted and compressed pages to decrypt to produce compressed pages of the bits of information, wherein the scramble unit scrambles the bits of information in the pages before being written to the storage cell groups and descrambles the bits of information for the pages read from the storage cell groups to produce unscrambled, encrypted and compressed second bits of information to send to the encryption unit.

Example 13 is a system to program information in storage cells of a memory device, including: a processor; a bus; a non-volatile memory storage device coupled to the bus and to receive data from the processor, comprising: a non-volatile memory having storage cells organized as pages, wherein each multi-level cell comprises a number of bits and can be programmed with information using a first number of threshold voltage levels, wherein the storage cells are organized into storage cell groups to which data is written, wherein each storage cell group is programmed to store a first number of bits of information; and a memory controller configured to program the storage cells and to: select a second number of bits of information from pages to write to one of the storage cell groups, wherein the second number of bits of information is less than the first number of bits of information; and program the storage cells of the storage cell group using threshold voltage levels from a second number of threshold voltage levels, wherein the second number of threshold voltage levels is less than the first number of threshold voltage levels and comprises a lowest of the first number of threshold voltage levels.

In Example 14, the subject matter of examples 15-19 can optionally include that the program the storage cells translates the second number of bits of information into the first number of bits of information to program using the threshold voltage levels from the second number of threshold voltage levels.

In Example 15, the subject matter of examples 14 and 16-19 can optionally include that each multi-level cell comprises n bits and can be programmed into $2^n$ separate states with $2^n$ different threshold voltage levels, wherein the first number of threshold voltage levels comprises $2^n$, wherein each of the storage cell groups has p storage cells, wherein each storage cell group represents $2^{np}$ states of information, wherein the first number of bits of information comprises m bits of information, where m=$Log_2(2^{np})$ bits of information, and wherein the selected second number of bits comprises k bits, where k<m, and wherein the second number of threshold voltage levels comprises j threshold voltage levels comprising only a j lowest of the $2^n$ different threshold voltage levels, wherein j<$2^n$ and j is a smallest integer greater than or equal to $2^{k/p}$.

In Example 16, the subject matter of examples 14, 16 and 17-19 can optionally include that the memory controller is further to: read a state of the storage cells in the storage cell group; decode the read state into decoded bits having the first number of bits of information; translate the decoded bits into translated bits having the second number of bits of information; and return the translated decoded bits to pages.

In Example 17, the subject matter of examples 14-16 and 18-19 can optionally include that the memory controller is further to: indicate one of a plurality of programming modes used for compression types of the pages from which bits are selected to store, wherein at least one of the programming modes is associated with translation functions based on a truth table associating states of the second number of bits of information with a subset of states of the first number of bits of information that are programmed using the second number of threshold voltage levels; read the first number of bits of information from one of the storage cell groups; and use the translation functions associated with the programming mode for the data in the storage cell group to translate the read first number of bits of information in one of the storage cell groups into a translated second number of bits of information.

In Example 18, the subject matter of examples 14-17 and 19 can optionally include that the memory controller is further to: configure pages used to store bits of information, wherein each of the configured pages is indicated as having one of the compression types, wherein the compression types include a low compression type, medium compression type, and high compression type, wherein the pages indicated as having the high compression type have fewer bits than pages having the low compression type and the medium compression type; determine a programming mode for the selected second number of bits of information from the pages, wherein the programming mode is based on the compression types of the pages from which the second number of bits of information are selected; and use the translation functions associated with the determined programming mode to determine the threshold voltage levels from the second number of threshold voltages to use to program the first number of bits of information in the storage cell group for the selected second number of bits of information.

In Example 19, the subject matter of examples 14-18 can optionally include a compression unit to receive as input pages and outputs instances of the pages with compressed data to the memory controller and to receive as input pages of compressed data to decompress to decompressed data.

Example 20 is a method for reading and writing data to storage cells in a non-volatile memory storage device, comprising: accessing storage cells in the non-volatile memory storage device organized as pages, wherein each multi-level cell comprises a number of bits and can be programmed with information using a first number of threshold voltage levels, wherein the storage cells are organized into storage cell groups to which data is written, wherein each storage cell group is programmed to store a first number of bits of information; selecting a second number of bits of information from pages to write to one of the storage cell groups, wherein the second number of bits of information is less than the first number of bits of information; and programming the storage cells of the storage cell group using threshold voltage levels from a second number of threshold voltage levels, wherein the second number of threshold voltage levels is less than the first number of threshold voltage levels and comprises a lowest of the first number of threshold voltage levels.

In Example 21, the subject matter of examples 20 and 21-25 can optionally include that the programing the storage cells translates the second number of bits of information into the first number of bits of information to program using the threshold voltage levels from the second number of threshold voltage levels.

In Example 22, the subject matter of examples 20, 21 and 23-25 can optionally include that each multi-level cell comprises n bits and can be programmed into $2^n$ separate states with $2^n$ different threshold voltage levels, wherein the first number of threshold voltage levels comprises $2^n$, wherein each of the storage cell groups has p storage cells, wherein each storage cell group represents $2^{np}$ states of information, wherein the first number of bits of information comprises m bits of information, where $m=\text{Log}_2(2^{np})$ bits of information, and wherein the selected second number of bits comprises k bits, where k<m, and wherein the second number of threshold voltage levels comprises j threshold voltage levels comprising only a j lowest of the $2^n$ different threshold voltage levels, wherein $j<2^n$ and j is a smallest integer greater than or equal to $2^{k/p}$.

In Example 23, the subject matter of examples 20-22 and 24-25 can optionally include: reading a state of the storage cells in the storage cell group; decoding the read state into decoded bits having the first number of bits of information; translating the decoded bits into translated bits having the second number of bits of information; and returning the translated decoded bits to pages.

In Example 24, the subject matter of examples 20-23 and 25 can optionally include: indicating one of a plurality of programming modes used for compression types of the pages from which bits are selected to store, wherein at least one of the programming modes is associated with translation functions based on a truth table associating states of the second number of bits of information with a subset of states of the first number of bits of information that are programmed using the second number of threshold voltage levels; reading the first number of bits of information from one of the storage cell groups; and using the translation functions associated with the programming mode for the data in the storage cell group to translate the read first number of bits of information in one of the storage cell groups into a translated second number of bits of information.

In Example 25, the subject matter of examples 20-24 can optionally include that: configuring pages used to store bits of information, wherein each of the configured pages is indicated as having one of the compression types, wherein the compression types include a low compression type, medium compression type, and high compression type, wherein the pages indicated as having the high compression type have fewer bits than pages having the low compression type and the medium compression type; determining a programming mode for the selected second number of bits of information from the pages, wherein the programming mode is based on the compression types of the pages from which the second number of bits of information are selected; and using the translation functions associated with the determined programming mode to determine the threshold voltage levels from the second number of threshold voltages to use to program the first number of bits of information in the storage cell group for the selected second number of bits of information.

In Example 22, the subject matter of example 20 further comprising at least any one of:

(1) wherein the program the storage cells translates the second number of bits of information into the first number of bits of information to program using the threshold voltage levels from the second number of threshold voltage levels; and/or (2) wherein each multi-level cell comprises n bits and can be programmed into $2^n$ separate states with $2^n$ different threshold voltage levels, wherein the first number of threshold voltage levels comprises $2^n$, wherein each of the storage cell groups has p storage cells, wherein each storage cell group represents $2^{np}$ states of information, wherein the first number of bits of information comprises m bits of information, where $m=\text{Log}_2(2^{np})$ bits of information, and wherein the selected second number of bits comprises k bits, where k<m, and wherein the second number of threshold voltage levels comprises j threshold voltage levels comprising only a j lowest of the $2^n$ different threshold voltage levels, wherein $j<2^n$ and j is a smallest integer greater than or equal to $2^{k/p}$; and/or (3) reading a state of the storage cells in the storage cell group; decoding the read state into decoded bits having the first number of bits of information; translate the decoded bits into translated bits having the second number of bits of information; and returning the translated decoded bits to pages; and/or (4) indicating one of a plurality of programming modes used for compression types of the pages from which bits are selected to store, wherein at least one of the programming modes is associated with translation functions based on a truth table associating states of the second number of bits of information with a subset of states of the first number of bits of information that are programmed using the second number of threshold voltage levels; reading the first number of bits of information from one of the storage cell groups; and using the translation functions associated with the programming mode for the data in the storage cell group to translate the read first number of bits of information in one of the storage cell groups into a translated second number of bits of information; and/or (5) configuring pages used to store bits of information, wherein each of the configured pages is indicated as having one of the compression types, wherein the compression types include a low compression type, medium compression type, and high compression type, wherein the pages indicated as having the high compression type have fewer bits than pages having the low compression type and the medium compression type; determining a programming mode for the selected second number of bits of information from the pages, wherein the programming mode is based on the compression types of the pages from which the second number of bits of information are selected; and using the translation functions associated with the determined programming mode to determine the threshold voltage levels from the second number of threshold voltages to use to program the first number of bits of information in the storage cell group for the selected second number of bits of information; and/or (6) wherein each of the storage cell groups comprises a storage cell pair of two storage cells, wherein the each of the storage cells stores two bits of information, wherein the first number of bits of information comprises four bits, wherein the second number of bits of information are selected from two pages, wherein in a first programming mode, the second number of bits of information comprises three bits, and wherein the translation functions for the first programming mode translates the read four bits from the storage cells into three bits, and wherein in a second programming mode, the second number of bits of information comprises two bits, and wherein the translation functions for the second programming mode translates the read four bits into two bits; and/or (7) determining a programming mode of data to read from the storage cell groups; read instances of the first number of bits of information from the storage cell groups to read; and translating the read instances of the first number of bits of information to translated instances of second number of bits of information using translation functions associated with the determined programming mode.

(8) wherein each of the storage cell groups comprises a storage cell pair of two storage cells wherein each of the storage cells store two bits, wherein the select the second number of bits of information comprises two bits, select a first bit from a lower page and a second bit from an upper page, wherein the second number of bits of information comprises three bits including one most significant bit (MSB) and two least significant bits (LSBs) programmed into the two storage cells in the storage cell group using threshold voltages from the second number of threshold voltages to program each of the two storage cells; and/or (9) selecting the two bits by selecting the bits from a first page and a second page for a current storage cell group comprises selecting one most significant bit and two least significant bits from different of the first and second pages from which the most significant bit and the two least significant bits were selected for a previous storage cell group programmed before the current storage cell group is programmed; and

(10) receiving, by a compression unit, input pages and outputting instances of the pages with compressed data to the memory controller and receiving as input pages of compressed data to decompress to decompressed data.

(11) wherein a compression unit receives as input pages to compress to produce the pages compressed to send to the encryption unit and to decompress the pages received from the encryption unit to produce the data in the pages decompressed, wherein an encryption unit encrypts the compressed pages from the compression unit to produce an encrypted and compressed pages of bits of information and receives encrypted and compressed pages to decrypt to produce compressed pages of the bits of information, wherein a scramble unit scrambles the bits of information in the pages before being written to the storage cell groups and descrambles the bits of information for the pages read from the storage cell groups to produce unscrambled, encrypted and compressed second bits of information to send to the encryption unit.

Example 27 is an apparatus for reading and writing data to storage cells in a non-volatile memory storage device, comprising: means for accessing storage cells in the non-volatile memory storage device organized as pages, wherein each multi-level cell comprises a number of bits and can be programmed with information using a first number of threshold voltage levels, wherein the storage cells are organized into storage cell groups to which data is written, wherein each storage cell group is programmed to store a first number of bits of information; means for selecting a second number of bits of information from pages to write to one of the storage cell groups, wherein the second number of bits of information is less than the first number of bits of information; and means for programming the storage cells of the storage cell group using threshold voltage levels from a second number of threshold voltage levels, wherein the second number of threshold voltage levels is less than the first number of threshold voltage levels and comprises a lowest of the first number of threshold voltage levels.

In Example 28, the subject matter of example 27 can optionally include that the programing the storage cells translates the second number of bits of information into the first number of bits of information to program using the threshold voltage levels from the second number of threshold voltage levels.

Example 29 is an apparatus comprising means to perform a method as claimed in any preceding claim.

Example 30 is a machine-readable storage including machine-readable instructions, when executed, to implement a method or realize an apparatus as claimed in any preceding claim.

What is claimed is:

1. An apparatus for programming a non-volatile memory having storage cells organized as pages, wherein each multi-level cell comprises a number of bits and can be programmed with information using a first number of threshold voltage levels, comprising:
    a memory controller configured to program the storage cells, wherein the storage cells are organized into storage cell groups to which data is written, wherein each storage cell group is programmed to store a first number of bits of information, and to:
        select a second number of bits of information from pages to write to one of the storage cell groups, wherein the second number of bits of information is less than the first number of bits of information; and
        program the storage cells of the storage cell group using threshold voltage levels from a second number of threshold voltage levels, wherein the second number of threshold voltage levels is less than the first number of threshold voltage levels and comprises a lowest of the first number of threshold voltage levels.

2. The apparatus of claim 1, wherein to program the storage cells translates the second number of bits of information into the first number of bits of information to program using the threshold voltage levels from the second number of threshold voltage levels.

3. The apparatus of claim 1, wherein each multi-level cell comprises n bits and can be programmed into $2^n$ separate states with $2^n$ different threshold voltage levels, wherein the first number of threshold voltage levels comprises $2^n$, wherein each of the storage cell groups has p storage cells, wherein each storage cell group represents $2^{np}$ states of information, wherein the first number of bits of information comprises m bits of information, where m=$Log_2(2^{np})$ bits of information, and wherein the selected second number of bits comprises k bits, where k<m, and wherein the second number of threshold voltage levels comprises j threshold voltage levels comprising only a j lowest of the $2^n$ different threshold voltage levels, wherein j<$2^n$ and j is a smallest integer greater than or equal to $2^{k/p}$.

4. The apparatus of claim 1, wherein the memory controller is further to:
indicate one of a plurality of programming modes used for compression types of the pages from which bits are selected to store, wherein at least one of the programming modes is associated with translation functions based on a truth table associating states of the second number of bits of information with a subset of states of the first number of bits of information that are programmed using the second number of threshold voltage levels;
read the first number of bits of information from one of the storage cell groups; and
use the translation functions associated with the programming mode for the data in the storage cell group to translate the read first number of bits of information in one of the storage cell groups into a translated second number of bits of information.

5. The apparatus of claim 4, wherein the memory controller is further to:
configure pages used to store bits of information, wherein each of the configured pages is indicated as having one of the compression types, wherein the compression types include a low compression type, medium compression type, and high compression type, wherein the pages indicated as having the high compression type have fewer bits than pages having the low compression type and the medium compression type;
determine a programming mode for the selected second number of bits of information from the pages, wherein the programming mode is based on the compression types of the pages from which the second number of bits of information are selected; and
use the translation functions associated with the determined programming mode to determine the threshold voltage levels from the second number of threshold voltages to use to program the first number of bits of information in the storage cell group for the selected second number of bits of information.

6. The apparatus of claim 4, wherein each of the storage cell groups comprises a storage cell pair of two storage cells, wherein the each of the storage cells stores two bits of information, wherein the first number of bits of information comprises four bits, wherein the second number of bits of information are selected from two pages, wherein in a first programming mode, the second number of bits of information comprises three bits, and wherein the translation functions for the first programming mode translate the read four bits from the storage cells into three bits, and
wherein in a second programming mode, the second number of bits of information comprises two bits, and wherein the translation functions for the second programming mode translate the read four bits into two bits.

7. The apparatus of claim 1, wherein the memory controller is further to:
determine a programming mode of data to read from the storage cell groups;
read instances of the first number of bits of information from the storage cell groups to read; and
translate the read instances of the first number of bits of information to translated instances of second number of bits of information using translation functions associated with the determined programming mode.

8. The apparatus of claim 1, wherein each of the storage cell groups comprises a storage cell pair of two storage cells wherein each of the storage cells stores two bits, wherein the second number of bits of information comprises two bits, select a first bit from a lower page and a second bit from an upper page, wherein the second number of bits of information comprises three bits including one most significant bit (MSB) and two least significant bits (LSBs) programmed into the two storage cells in the storage cell group using threshold voltages from the second number of threshold voltages to program each of the two storage cells.

9. The apparatus of claim 8, wherein the memory controller is further to select the two bits by selecting the bits from a first page and a second page for a current storage cell group comprises selecting one most significant bit and two least significant bits from different of the first and second pages from which the most significant bit and the two least significant bits were selected for a previous storage cell group programmed before the current storage cell group is programmed.

10. The apparatus of claim 1, further comprising:
a compression unit to receive as input pages and outputs instances of the pages with compressed data to the memory controller and to receive as input pages of compressed data to decompress to decompressed data.

11. The apparatus of claim 1, further comprising:
a compression unit;
an encryption unit; and
a scramble unit;
wherein the compression unit receives as input pages to compress to produce compressed pages to send to the encryption unit and to decompress the pages received from the encryption unit to produce the data in the pages decompressed,
wherein the encryption unit encrypts the compressed pages from the compression unit to produce an encrypted and compressed pages of bits of information and receives encrypted and compressed pages to decrypt to produce compressed pages of the bits of information, and
wherein the scramble unit scrambles the bits of information in the pages before being written to the storage cell groups and descrambles the bits of information for the pages read from the storage cell groups to produce unscrambled, encrypted and compressed second bits of information to send to the encryption unit.

12. An apparatus for programming a non-volatile memory having storage cells organized as pages, wherein each multi-level cell comprises a number of bits and can be programmed with information using a first number of threshold voltage levels, comprising:
- a memory controller configured to program the storage cells, wherein the storage cells are organized into storage cell groups to which data is written, wherein each storage cell group is programmed to store a first number of bits of information, and to:
  - select a second number of bits of information from pages to write to one of the storage cell groups, wherein the second number of bits of information is less than the first number of bits of information;
  - program the storage cells of the storage cell group using threshold voltage levels from a second number of threshold voltage levels, wherein the second number of threshold voltage levels is less than the first number of threshold voltage levels and comprises a lowest of the first number of threshold voltage levels;
  - read a state of the storage cells in the storage cell group;
  - decode the read state into decoded bits having the first number of bits of information;
  - translate the decoded bits into translated bits having the second number of bits of information; and
  - return the translated decoded bits to pages.

13. A system in communication with a processor and a bus, including:
- a non-volatile memory storage device coupled to the bus and to receive data from the processor, comprising:
  - a non-volatile memory having storage cells organized as pages, wherein each multi-level cell comprises a number of bits and can be programmed with information using a first number of threshold voltage levels, wherein the storage cells are organized into storage cell groups to which data is written, wherein each storage cell group is programmed to store a first number of bits of information; and
  - a memory controller configured to program the storage cells and to:
    - select a second number of bits of information from pages to write to one of the storage cell groups, wherein the second number of bits of information is less than the first number of bits of information; and
    - program the storage cells of the storage cell group using threshold voltage levels from a second number of threshold voltage levels, wherein the second number of threshold voltage levels is less than the first number of threshold voltage levels and comprises a lowest of the first number of threshold voltage levels.

14. The system of claim 13, wherein the program the storage cells translates the second number of bits of information into the first number of bits of information to program using the threshold voltage levels from the second number of threshold voltage levels.

15. The system of claim 13, wherein each multi-level cell comprises n bits and can be programmed into $2^n$ separate states with $2^n$ different threshold voltage levels, wherein the first number of threshold voltage levels comprises $2^n$, wherein each of the storage cell groups has p storage cells, wherein each storage cell group represents $2^{np}$ states of information, wherein the first number of bits of information comprises m bits of information, where m=$Log_2(2^{np})$ bits of information, and wherein the selected second number of bits comprises k bits, where k<m, and wherein the second number of threshold voltage levels comprises j threshold voltage levels comprising only a j lowest of the $2^n$ different threshold voltage levels, wherein j<$2^n$ and j is a smallest integer greater than or equal to $2^{k/p}$.

16. The system of claim 13, wherein the memory controller is further to:
- indicate one of a plurality of programming modes used for compression types of the pages from which bits are selected to store, wherein at least one of the programming modes is associated with translation functions based on a truth table associating states of the second number of bits of information with a subset of states of the first number of bits of information that are programmed using the second number of threshold voltage levels;
- read the first number of bits of information from one of the storage cell groups; and
- use the translation functions associated with the programming mode for the data in the storage cell group to translate the read first number of bits of information in one of the storage cell groups into a translated second number of bits of information.

17. The system of claim 16, wherein the memory controller is further to:
- configure pages used to store bits of information, wherein each of the configured pages is indicated as having one of the compression types, wherein the compression types include a low compression type, medium compression type, and high compression type, wherein the pages indicated as having the high compression type have fewer bits than pages having the low compression type and the medium compression type;
- determine a programming mode for the selected second number of bits of information from the pages, wherein the programming mode is based on the compression types of the pages from which the second number of bits of information are selected; and
- use the translation functions associated with the determined programming mode to determine the threshold voltage levels from the second number of threshold voltages to use to program the first number of bits of information in the storage cell group for the selected second number of bits of information.

18. The system of claim 13, further comprising:
- a compression unit to receive as input pages and outputs instances of the pages with compressed data to the memory controller and to receive as input pages of compressed data to decompress to decompressed data.

19. A system in communication with a processor and a bus, including:
- a non-volatile memory storage device coupled to the bus and to receive data from the processor, comprising:
  - a non-volatile memory having storage cells organized as pages, wherein each multi-level cell comprises a number of bits and can be programmed with information using a first number of threshold voltage levels, wherein the storage cells are organized into storage cell groups to which data is written, wherein each storage cell group is programmed to store a first number of bits of information; and
  - a memory controller configured to program the storage cells and to:
    - select a second number of bits of information from pages to write to one of the storage cell groups, wherein the second number of bits of information is less than the first number of bits of information;

program the storage cells of the storage cell group using threshold voltage levels from a second number of threshold voltage levels, wherein the second number of threshold voltage levels is less than the first number of threshold voltage levels and comprises a lowest of the first number of threshold voltage levels;

read a state of the storage cells in the storage cell group;

decode the read state into decoded bits having the first number of bits of information;

translate the decoded bits into translated bits having the second number of bits of information; and return the translated decoded bits to pages.

20. A method for reading and writing data to a non-volatile memory storage device, comprising:

accessing storage cells in the non-volatile memory storage device organized as pages, wherein each multi-level cell comprises a number of bits and can be programmed with information using a first number of threshold voltage levels, wherein the storage cells are organized into storage cell groups to which data is written, wherein each storage cell group is programmed to store a first number of bits of information;

selecting a second number of bits of information from pages to write to one of the storage cell groups, wherein the second number of bits of information is less than the first number of bits of information; and programming the storage cells of the storage cell group using threshold voltage levels from a second number of threshold voltage levels, wherein the second number of threshold voltage levels is less than the first number of threshold voltage levels and comprises a lowest of the first number of threshold voltage levels.

21. The method of claim 20, wherein the programming the storage cells translates the second number of bits of information into the first number of bits of information to program using the threshold voltage levels from the second number of threshold voltage levels.

22. The method of claim 20, wherein each multi-level cell comprises n bits and can be programmed into $2^n$ separate states with $2^n$ different threshold voltage levels, wherein the first number of threshold voltage levels comprises $2^n$, wherein each of the storage cell groups has p storage cells, wherein each storage cell group represents $2^{np}$ states of information, wherein the first number of bits of information comprises m bits of information, where m=$Log_2(2^{np})$ bits of information, and wherein the selected second number of bits comprises k bits, where k<m, and wherein the second number of threshold voltage levels comprises j threshold voltage levels comprising only a j lowest of the $2^n$ different threshold voltage levels, wherein j<$2^n$ and j is a smallest integer greater than or equal to $2^{k/p}$.

23. The method of claim 20, further comprising:

indicating one of a plurality of programming modes used for compression types of the pages from which bits are selected to store, wherein at least one of the programming modes is associated with translation functions based on a truth table associating states of the second number of bits of information with a subset of states of the first number of bits of information that are programmed using the second number of threshold voltage levels;

reading the first number of bits of information from one of the storage cell groups; and using the translation functions associated with the programming mode for the data in the storage cell group to translate the read first number of bits of information in one of the storage cell groups into a translated second number of bits of information.

24. The method of claim 23, further comprising:

configuring pages used to store bits of information, wherein each of the configured pages is indicated as having one of the compression types, wherein the compression types include a low compression type, medium compression type, and high compression type, wherein the pages indicated as having the high compression type have fewer bits than pages having the low compression type and the medium compression type;

determining a programming mode for the selected second number of bits of information from the pages, wherein the programming mode is based on the compression types of the pages from which the second number of bits of information are selected; and using the translation functions associated with the determined programming mode to determine the threshold voltage levels from the second number of threshold voltages to use to program the first number of bits of information in the storage cell group for the selected second number of bits of information.

25. A method for reading and writing data to a non-volatile memory storage device, comprising:

accessing storage cells in the non-volatile memory storage device organized as pages, wherein each multi-level cell comprises a number of bits and can be programmed with information using a first number of threshold voltage levels, wherein the storage cells are organized into storage cell groups to which data is written, wherein each storage cell group is programmed to store a first number of bits of information;

selecting a second number of bits of information from pages to write to one of the storage cell groups, wherein the second number of bits of information is less than the first number of bits of information;

programming the storage cells of the storage cell group using threshold voltage levels from a second number of threshold voltage levels, wherein the second number of threshold voltage levels is less than the first number of threshold voltage levels and comprises a lowest of the first number of threshold voltage levels;

reading a state of the storage cells in the storage cell group;

decoding the read state into decoded bits having the first number of bits of information;

translating the decoded bits into translated bits having the second number of bits of information; and returning the translated decoded bits to pages.

* * * * *